United States Patent [19]

Shaw et al.

[11] Patent Number: 5,461,577
[45] Date of Patent: Oct. 24, 1995

[54] COMPREHENSIVE LOGIC CIRCUIT LAYOUT SYSTEM

[75] Inventors: Ching-Hao Shaw, Plano; Patrick Bosshart, Dallas; Douglas Matzke, Dallas; Vibhu Kalyan, Dallas; Theodore W. Houston, Richardson, all of Tex.

[73] Assignee: Texas Instruments Incorporated, Dallas, Tex.

[21] Appl. No.: 845,302

[22] Filed: Mar. 3, 1992

Related U.S. Application Data

[62] Division of Ser. No. 546,612, Jun. 29, 1990, Pat. No. 5,119,313, which is a continuation of Ser. No. 100,669, Sep. 24, 1987, abandoned, which is a continuation-in-part of Ser. No. 81,419, Aug. 4, 1987, Pat. No. 4,870,598.

[51] Int. Cl.$^6$ .................................................. G06F 17/50
[52] U.S. Cl. ........................ 364/491; 364/490; 364/489; 364/488
[58] Field of Search ................................. 364/488, 489, 364/490, 491

[56] References Cited

U.S. PATENT DOCUMENTS

| | | | |
|---|---|---|---|
| T940,008 | 11/1975 | Oden et al. | 364/490 |
| T943,001 | 2/1976 | Mennone | 364/490 |
| T944,001 | 3/1976 | Hanan et al. | 364/490 |
| 4,839,821 | 6/1989 | Murakata | 364/491 |
| 4,864,381 | 9/1989 | Seefeldt et al. | 364/491 |
| 4,870,598 | 9/1989 | Shaw et al. | 364/491 |
| 5,119,313 | 6/1992 | Shaw et al. | 364/491 |
| 5,128,871 | 7/1992 | Schmitz | 364/490 |
| 5,189,628 | 2/1993 | Olsen et al. | 364/489 |

OTHER PUBLICATIONS

"Chortle: A Technology Mapping Program for Look-up Table Based Field Programmable Gate Arrays" by Francis et al., IEEE 27th ACM/Design Automatioin Conf., 1990, pp. 613–619.

*Primary Examiner*—Vincent N. Trans
*Attorney, Agent, or Firm*—W. James Brady, III; Richard L. Donaldson

[57] ABSTRACT

Random logic circuitry (210) is laid out in a logic array (212) that has a plurality of row and column locations. The logic circuitry (210) implements a plurality of dynamic logic circuits, each logic circuit having a plurality of logic gate field effect transistors (224) each formed at a selected intersection of one of the row locations and a predetermined plurality of the column locations. Elongate gate conductors (584–602) are formed at selected row locations in the logic array (212), each gate conductor provided as a gate for one or more of the logic gate transistors (224). Selected ones (e.g. 514, 544) of the transistors are merged in a row direction if the logic does not require them to be isolated from one another. A plurality of elongate second conductors (222) interconnect to selected ones of the sources or drains of the transistors (224). Non-Boolean portions of the logic circuitry are formed in an adjacent tile section (214) in the semiconductor layer separate from the logic array (212). A plurality of river-routed conductors (e.g. AL, F, LL) each connect together a respective array terminal (710, 712), and a terminal of a respective non-Boolean tile.

21 Claims, 13 Drawing Sheets

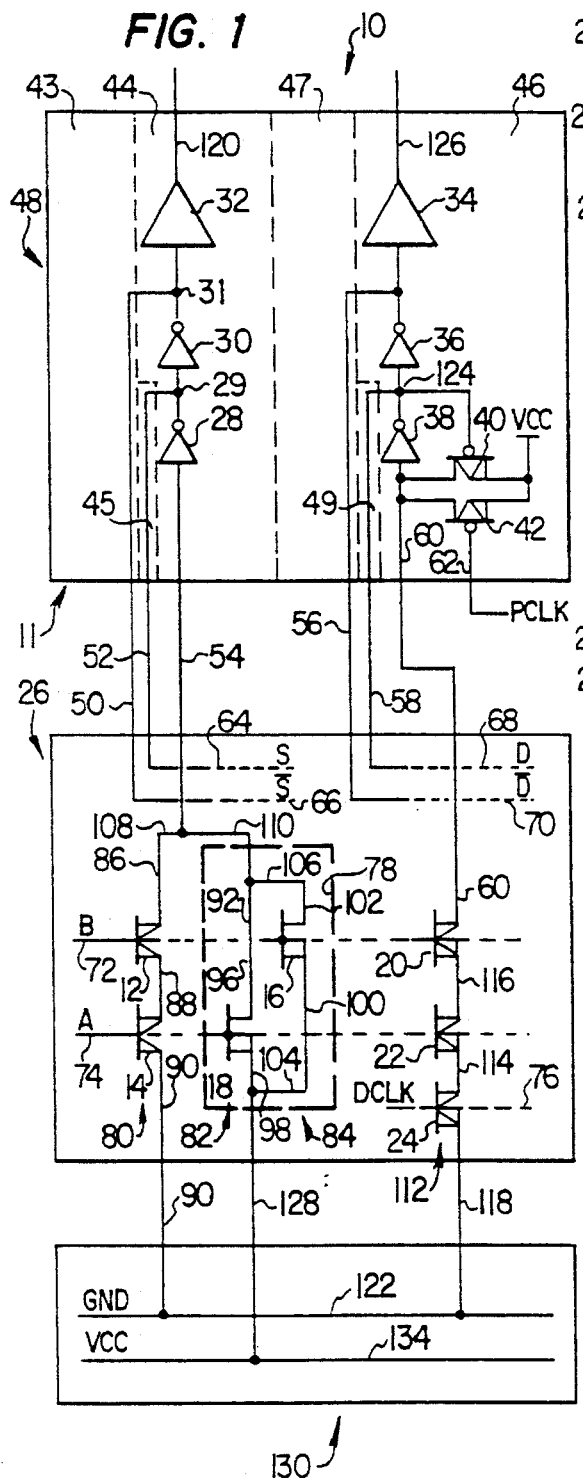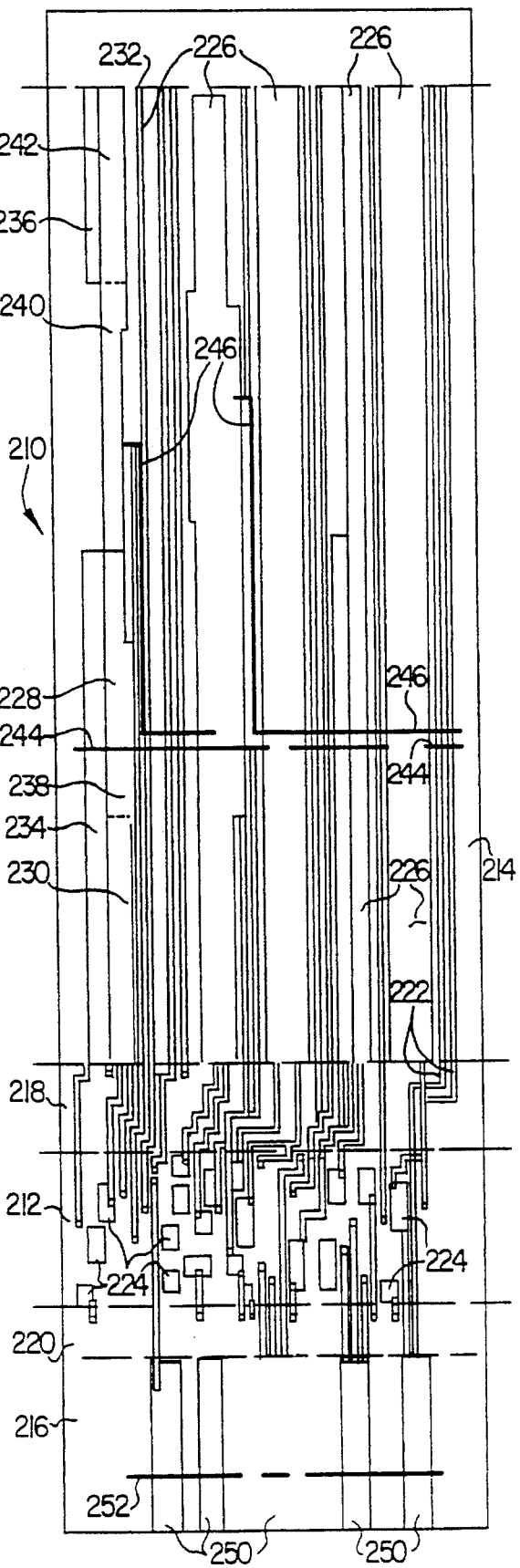

FIG. 3

DEFLOGIC 170
DEFLATCH AL 172
  (PH2) (//BX) (//CX) (DX) (//EX) (FX) (//GX) (HX) (IX)
DEFLATCH J— 176
  (PH1RUN) ((//KL)+(LL)) (//ML)
DEFLATCH KL 178
  (PH2) (N)
DEFEQN L— 180
  (P) (//G) (//FX)
DEFEQN L—
  (//L)
DEFLATCH LL 190
  (PH2) (L)
DEFREGISTER Q 182
  (PH1RUN) ((R)+(J)) ((Q+(V))
DEFCLOCK V 184
186 — (PH1) ((//ML)(M)+(PH1SCAN)(YSCAN))
DEFCLOCK Z
  (PH1SCAN) (AASCAN)
DEFCLOCK AE
  (PH1) ((//ML) (AL)+(PH1SCAN)(AGSCAN))

187
DEFCLOCK AH
  (PH1RUN) ((//I)+(//F))(//J)(AJ)(Q)
DEFCLOCK AJ
  (PH2)((I)(H)(G)+(PH2SCAN)(AASCAN))
DEFCLOCK AM
  (PH2)((//I)(H)(G)+(PH2SCAN)(AGSCAN))
DEFSCANADDRREG AASCAN
  (Z) 188
DEFSCANADDRREG AGSCAN
DEFEQN AN
  (F)+(I)
OUTPUT TERMS
  AE AM AV Z AJ ML AW J AN AX AY AZ
  BA AI AH Q U BB BC
REQUIRED INPUTS
  P IX HX I H G F E D C AI BA
  N R BD PH1SCAN PH1RUN PH2 PH2SCAN A U
  ML PH1

FIG. 4b 0  2PH2
1  10//F 24P
2  12 PH1RUN 20//FX
3  2J 24//G
4  2R 10//H
5  0//KL 18G
6  3U 11//J 18H
7  3Q 13LL 25I
8  8//ML 22F
9  7AI 17AL
10
11
12
13
14
15 IN

| 0 | 1 | 2 | 3 | 4 | 5 | 6 | 7 | 8 | 9 | 10 | 11 | 12 | 13 | 14 | 15 | COLUMN NUMBER | | |
|---|---|---|---|---|---|---|---|---|---|---|---|---|---|---|---|---|---|---|
| - | - | - | - | - | 0 | - | - | - | - | - | - | - | - | - | - | 0 | KL | NIL FDBK-NIL |
| - | - | - | - | - | ! | - | - | - | - | - | - | - | - | - | - | 1 | N | DEFLATCH NIL |
| 1 | - | - | 1 | 1 | ! | - | - | - | - | - | - | - | - | - | ! | 2 | Q | DEFREGISTER OUT FIRST-OR-TERM |
| ! | - | - | ! | ! | ! | 1 | 1 | - | - | - | - | - | - | - | ! | 3 | Q | DEFREGISTER OUT OR-TERM |
| ! | - | - | ! | ! | ! | ! | 1 | - | - | - | - | - | - | - | ! | 4 | Q | NIL FDBK-TRUE |
| ! | - | - | ! | I | ! | ! | ! | - | - | - | - | - | - | - | ! | 5 | R | TRUE FROM-TOP |
| ! | - | - | ! | - | ! | I | ! | - | - | - | - | - | - | - | ! | 6 | U | TRUE FROM-TOP |
| ! | - | - | ! | - | ! | - | ! | - | 1 | - | - | - | - | - | ! | 7 | AI | TRUE FROM-TOP |
| ! | - | - | ! | - | ! | - | ! | 0 | ! | - | - | - | - | - | ! | 8 | ML | NIL NIL NIL-FROM-BOTTOM CBINV |
| ! | - | - | ! | - | ! | - | ! | ! | ! | -202 | - | - | - | - | I | 9 | N | TRUE FROM-TOP |
| 1 | 0 | - | ! | 0 | ! | - | ! | ! | ! | - | - | - | - | - | - | 10 | AH | DEFCLOCK OUT FIRST-OR-TERM |
| ! | ! | - | ! | ! | ! | 0 | ! | ! | 1 | - | - | - | - | - | - | 11 | AH | DEFCLOCK OUT LAST-AND-TERM |
| ! | ! | 1 | ! | ! | 0 | ! | - | ! | ! | - | - | - | - | - | - | 12 | J | DEFLATCH OUT |
| ! | ! | 1 | ! | ! | - | ! | 1 | 0 | ! | - | - | - | - | - | - | 13 | J | DEFLATCH OUT |
| ! | ! | ! | ! | ! | - | 0 | ! | ! | ! | - | - | - | - | - | - | 14 | J | NIL FDBK-NIL |
| ! | ! | ! | I | ! | - | - | ! | ! | ! | - | - | - | - | - | - | 15 | J | NIL FDBK-TRUE |
| ! | ! | 1 | - | ! | - | - | ! | ! | ! | - | - | - | - | - | - | 16 | PH1RUN | RUN TRUE TRUE-FROM-BOTTOM |
| ! | ! | I | - | ! | - | - | ! | 0 | 1 | - | - | - | - | - | - | 17 | AE | DEFCLOCK OUT |
| 1 | ! | - | - | 0 | 1 | 1 | ! | - | ! | - | - | - | - | - | - | 18 | AM | DEFCLOCK OUT |
| ! | ! | - | - | ! | ! | ! | ! | - | 1 | - | - | - | - | - | - | 19 | A | TRUE FROM-TOP |
| ! | ! | 0 | - | ! | ! | ! | ! | - | - | - | - | - | - | - | - | 20 | F | FX NIL CBREG CBINV |
| ! | 0 | ! | - | ! | ! | ! | ! | - | - | - | - | - | - | - | - | 21 | F | NIL NIL-FROM-BOTTOM CBINV |
| ! | - | ! | - | ! | ! | ! | ! | 1 | - | - | - | - | - | - | - | 22 | F | TRUE FROM-TOP |
| ! | - | ! | - | ! | ! | ! | I | ! | - | - | - | - | - | - | - | 23 | LL | NIL FDBK-TRUE |
| ! | 1 | 0 | 0 | ! | ! | ! | - | ! | - | - | - | - | - | - | - | 24 | L | DEFEQN LATCH |
| ! | ! | - | 1 | ! | ! | ! | 1 | I | - | - | - | - | - | - | - | 25 | AN | DEFEQN OUT FIRDT-OR-TERM |
| ! | ! | - | 0 | ! | ! | ! | - | - | - | - | - | - | - | - | - | 26 | G | NIL NIL-FROM-BOTTOM CBINV |
| ! | ! | - | - | ! | 1 | ! | - | - | - | - | - | - | - | - | - | 27 | G | TRUE FROM-TOP |
| ! | ! | - | - | ! | ! | ! | - | - | - | - | - | - | - | - | - | 28 | P | TRUE TRUE-FROM-BOTTOM |
| ! | - | - | - | ! | ! | ! | - | - | - | - | - | - | - | - | - | 29 | Z | DEFCLOCK OUT |
| 1 | - | - | - | ! | ! | 1 | - | - | - | - | - | - | - | - | - | 30 | AJ | DEFCLOCK OUT |
| ! | - | - | - | ! | ! | ! | - | - | - | - | - | - | - | - | - | 31 | I | NIL NIL-FROM-BOTTOM CBINV |
| ! | - | - | - | 0 | - | ! | I | - | - | - | - | - | - | - | - | 32 | I | TRUE FROM-TOP |
| I | - | - | - | - | - | ! | - | - | - | - | - | - | - | - | - | 33 | PH2 | TRUE TRUE-FROM-BOTTOM |
| - | - | - | - | - | I | - | - | - | - | - | - | - | - | - | - | 34 | H | TRUE FROM-TOP |

ROW OR TRACK NUMBER

*FIG. 4a*

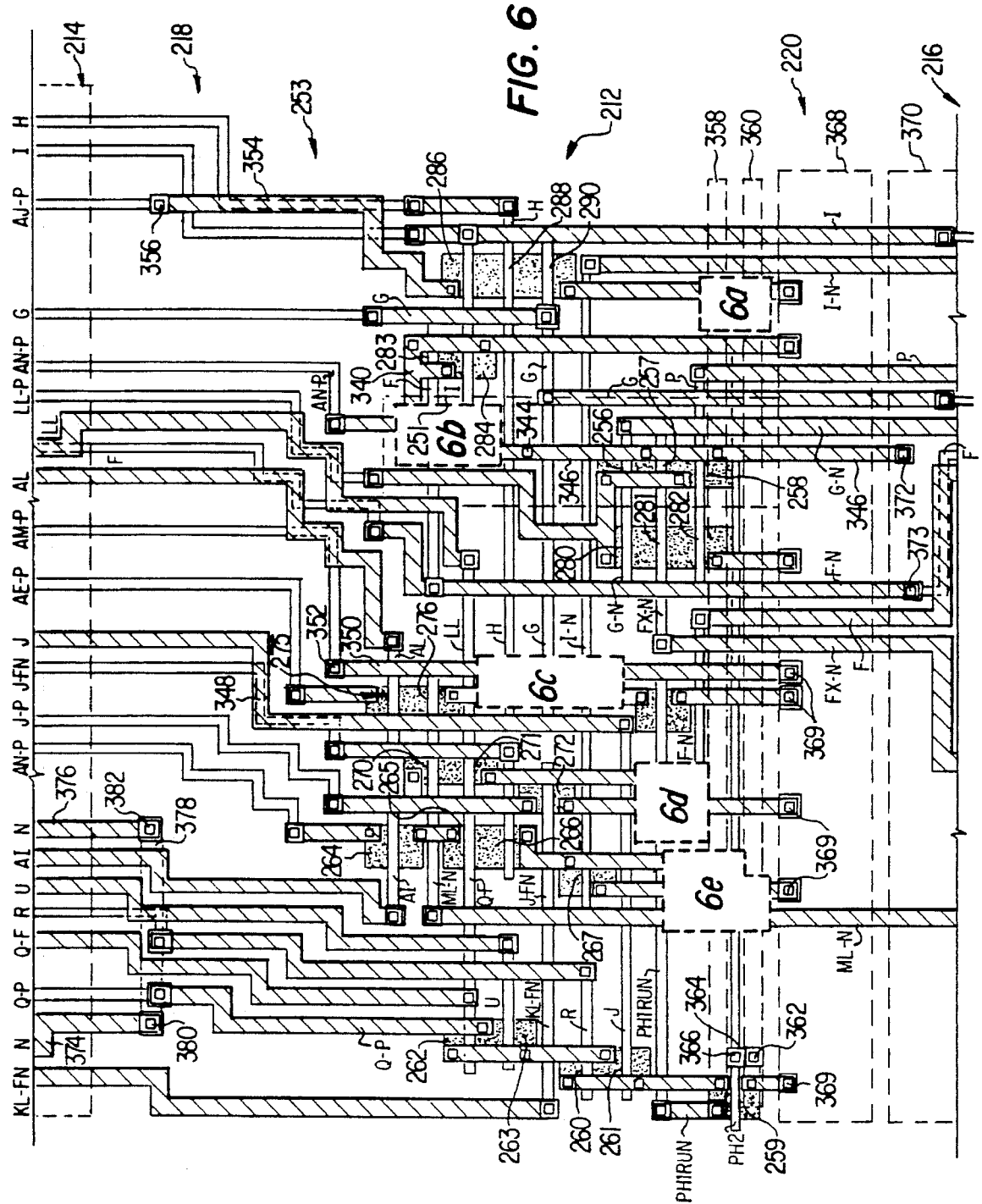

TRANARRAY
COLUMN INDEX

```
          0  1  2  3  4  5
      10
       9
       8        T
       7        T
R  6  T
O  5  T
W  4
I  3  T  T
N  2  T  T
D  1  T  T
E  0  T  T
X
```

CTORARRAY
COLUMN INDEX

```
          0  1  2  3  4  5
      10
       9     C
       8
R  7  C
O  6
W  5  C
   4     C  C
I  3
N  2
D  1
E  0     C  C
X
```

MET1ARRAY
COLUMN INDEX

```
          0  1  2  3  4  5
      10     F  F
       9     F
       8     F
R  7        F
O  6        F
W  5     F  F
   4
I  3
N  2
D  1
E  0     F  F
X
```

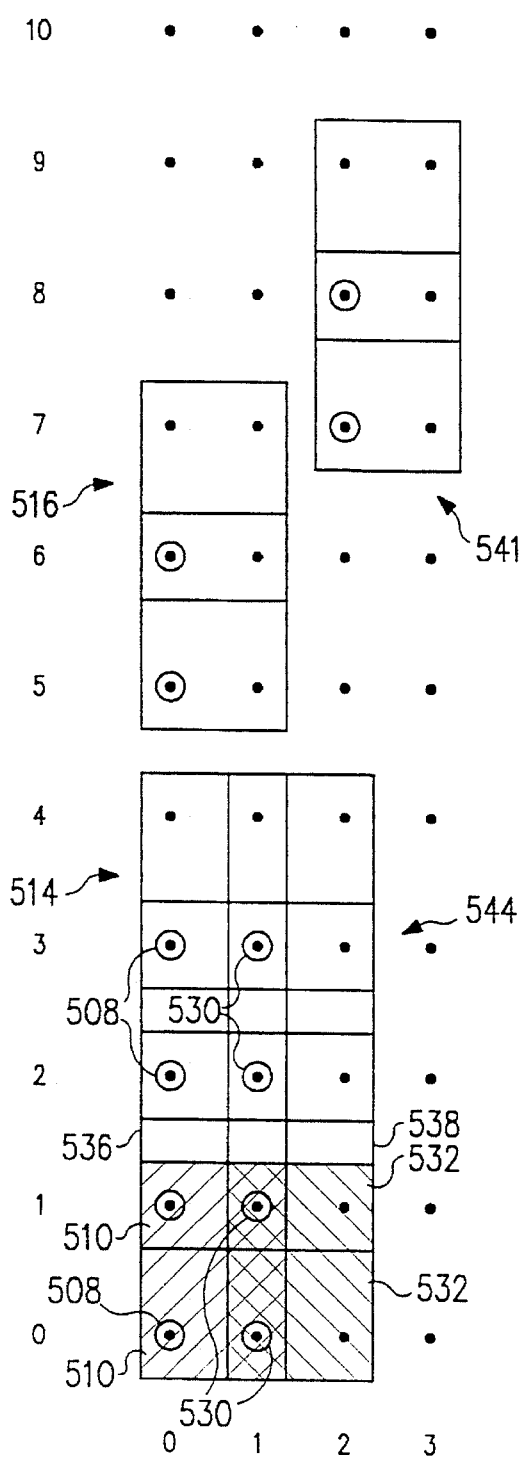
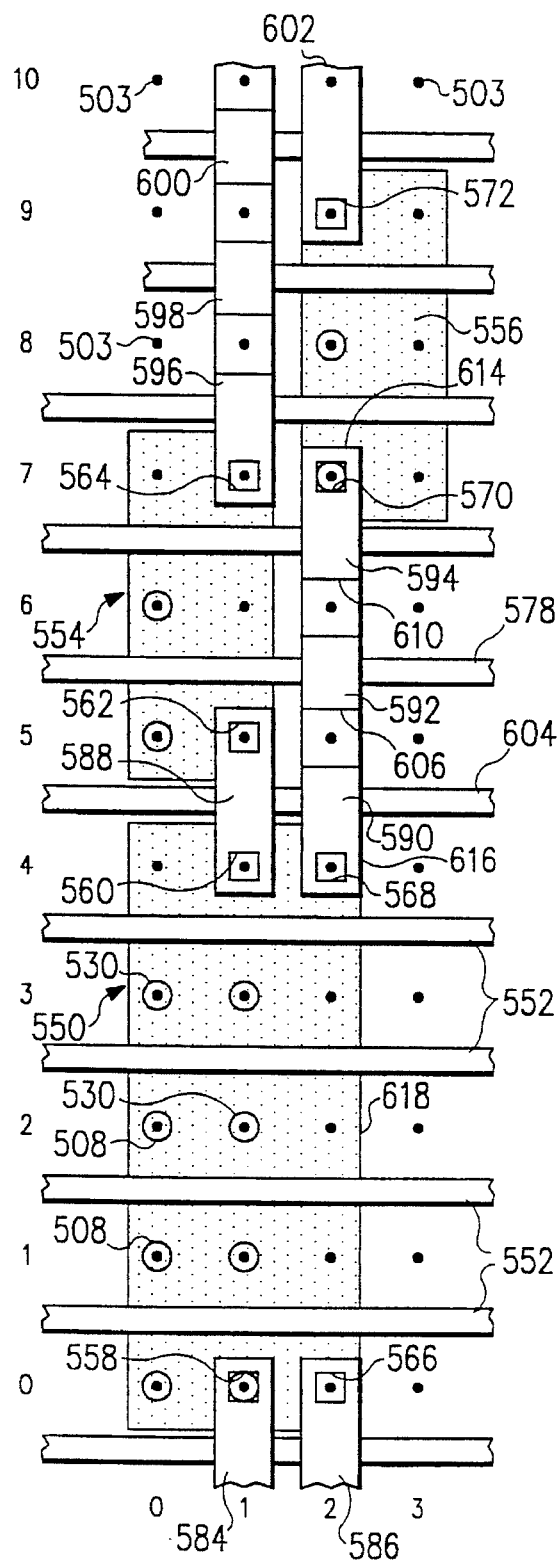
FIG. 11b
FIG. 11c

FIG. 13a — POLY RR ARRAY

|    | 17 | 18 | 19 | 20 | 21 | 22 | 23 | 24 | 25 | 26 | 27 |
|----|----|----|----|----|----|----|----|----|----|----|----|
| 19 |    |    |    |    |    |    |    | T  | T  | T  | T  |
| 18 |    |    |    |    |    |    |    |    |    |    | U  |
| 17 |    |    |    |    |    |    |    |    |    |    | U  |
| 16 |    |    |    |    |    |    |    |    |    |    | U  |
| 15 |    |    |    |    |    |    |    |    |    |    | U  |
| 14 |    |    |    |    |    |    |    |    |    |    | U  |
| 13 |    |    |    |    |    |    |    |    |    |    | U  |
| 12 |    |    |    |    |    |    |    |    |    |    | U  |
| 11 |    |    |    |    |    |    |    |    | R  | R  | U  |
| 10 | X  |    |    |    |    |    |    |    | X  | X  | X  |
| 9  | T  | X  |    |    |    |    |    |    | X  | T  | X  | Q |
| 8  | C  | X  | T  | G  | G  | G  | G  | Q  | C  | G  | X  |
| 7  | C  | G  | C  | T  | X  | X  | X  | X  | C  | X  | Q  |
| 6  | C  | G  | C  | C  | G  | G  | G  | X  | C  | G  | G  |
| 5  | C  | G  | C  | C  | G  | G  | G  | G  | C  | G  | G  |
| 4  | C  | G  | C  | C  | T  | G  | X  | Q  | C  | G  | G  |
| 3  | C  | X  | C  | C  | C  | G  | Q  | X  | C  | X  | X  |

FIG. 13b — 1MET RR ARRAY

|    | 17 | 18 | 19 | 20 | 21 | 22 | 23 | 24 | 25 | 26 | 27 |
|----|----|----|----|----|----|----|----|----|----|----|----|
| 19 |    |    |    |    |    |    |    | T  | T  | T  | T  |
| 11 |    |    |    |    |    |    |    |    | S  |    |    |
| 10 |    |    |    |    |    |    |    | X  | U  | X  |    |
| 9  | T  |    |    |    |    |    |    | X  | T  | X  | X  |
| 8  | C  |    | T  |    |    |    |    | X  | C  | X  | X  |
| 7  | C  |    | C  | T  |    |    |    | X  | C  | X  | X  |
| 6  | C  |    | C  | C  |    |    |    | X  | C  | X  | X  |
| 5  | C  |    | C  | C  |    | X  | X  | X  | C  | X  | X  |
| 4  | C  |    | C  | C  | T  | X  | X  | X  | C  | X  | X  |
| 3  | C  |    | C  | C  | C  | X  | X  | X  | C  | X  | X  |

FIG. 14a — POLY RR ARRAY

|    | 17 | 18 | 19 | 20 | 21 | 22 | 23 | 24 | 25 | 26 | 27 |
|----|----|----|----|----|----|----|----|----|----|----|----|
| 19 |    |    |    |    |    |    |    | T  | T  | T  | T  |
| 18 |    |    |    |    |    |    |    |    | U  | U  |    |
| 17 |    |    |    |    |    |    |    |    | U  | U  |    |
| 16 |    |    |    |    |    |    |    |    | U  | U  |    |
| 15 |    |    |    |    |    |    |    |    | U  | U  |    |
| 14 |    |    |    |    |    |    |    |    | U  | U  |    |
| 13 |    |    |    |    |    |    |    |    | U  | U  |    |
| 12 |    |    |    |    |    |    |    | R  | R  | U  | U  |
| 11 |    |    |    |    |    |    |    | R  | U  | R  | R  | U |
| 10 | X  |    |    |    |    |    |    | U  | X  | X  | X  |
| 9  | T  | X  |    |    |    |    |    |    | X  | T  | X  | Q |
| 8  | C  | X  | T  | G  | G  | G  | G  | Q  | C  | G  | X  |
| 7  | C  | G  | C  | T  | X  | X  | X  | X  | C  |    | Q  |
| 6  | C  | G  | C  | C  | G  | G  | G  | X  | C  | G  | G  |
| 5  | C  | G  | C  | C  | G  | G  | G  | G  | C  | G  | G  |
| 4  | C  | G  | C  | C  | T  | G  | X  | Q  | C  | G  | G  |
| 3  | C  | X  | C  | C  | C  | G  | Q  | X  | C  | X  | X  |

FIG. 14b — 1MET RR ARRAY

|    | 17 | 18 | 19 | 20 | 21 | 22 | 23 | 24 | 25 | 26 | 27 |
|----|----|----|----|----|----|----|----|----|----|----|----|
| 19 |    |    |    |    |    |    |    | T  | T  | T  | T  |
| 11 |    |    |    |    |    |    |    |    | S  |    |    |
| 10 |    |    |    |    |    |    |    | S  | X  | U  | X  |
| 9  | T  |    |    |    |    |    |    | U  | X  | T  | X  | X |
| 8  | C  |    | T  |    |    |    |    | U  | X  | C  | X  | X |
| 7  | C  |    | C  | T  |    |    |    | U  | X  | C  | X  | X |
| 6  | C  |    | C  | C  |    |    | R  | R  | U  | X  | C  | X | X |
| 5  | C  |    | C  | C  | U  | X  | X  | X  | C  | X  | X  |
| 4  | C  |    | C  | C  | T  | X  | X  | X  | C  | X  | X  |
| 3  | C  |    | C  | C  | C  | X  | X  | X  | C  | X  | X  |

FIG. 15a  POLY RR ARRAY

FIG. 15b  1MET RR ARRAY

COMPREHENSIVE LOGIC CIRCUIT LAYOUT SYSTEM

RELATED APPLICATION

This is a division of application Ser. No. 07/546,612, filed Jun. 29, 1990, now U.S. Pat. No. 5,119,313, which is a continuation of application Ser. No. 07/100,669, filed Sep. 24, 1987, now abandoned, which is a continuation-in-part of application Ser. No. 07/81,419, filed Aug. 4, 1987, now U.S. Pat. No. 4,870,598.

TECHNICAL FIELD OF THE INVENTION

This invention relates in general to the synthesis and layout of logic circuitry, and more particularly relates to a method and system for synthesizing the layout of dynamic and static control logic circuitry in a monolithic integrated circuit.

BACKGROUND OF THE INVENTION

A high degree of circuit irregularity exists in the control sections of microprocessor units. Various strategies have been used in the past to automate the layout of these control sections as much as possible. Standard cell design styles and programmable logic arrays (PLAS) are two conventional approaches. The standard cell design style is however in general restricted to static gates, and further has a relatively poor density in the finalized design due to large routing area.

All conventional standard cells are fabricated using static CMOS gates. It would be impossible or highly impractical to fabricate dynamic domino logic using them, although standard cells can be used to fabricate registers and state machines. Even here, the standard cell approach suffers from low layout design densities and relatively poor speed and timing performance.

The PLA design style does not allow the free mix of static and dynamic gates without a large cost penalty in terms of layout area.

Another design style is the Weinberger array, as pioneered by A. Weinberger in "Large Scale Integration of MOS Complex Logic," *IEEE Solid State Circuits*, Vol. SC-II, pp. 182–190 (December, 1967). A Weinberger array comprises a plurality of elongate gate regions formed at a face of a semiconductor substrate, and interconnected by a plurality of conductors running orthogonally to the gate regions.

Recently, the Stanford Weinberger Array Minimizer and Implementor (SWAMI) logic design system has been disclosed in C. Rowen and J. Hennessy, "SWAMI: A Flexible Logic Implementation System," *IEEE Twenty-second Design Automation Conference*, pp. 169–175 (1985). The SWAMI logic implementation system generates multi-level logic expressions from an algorithmic description of a combinational function. The combinational function includes NAND and NOR expressions. The SWAMI Weinberger implementation is however limited to NMOS technology. Further, the Weirberger array methodology does not allow the mixture of dynamic and static gates, and is unable to incorporate such circuit structures as buffers or registers.

U.S. Pat. No. 4,319,396 issued to Law et al. discloses a gate-matrix method for fabricating insulated gate field-effect transistor (IGFET) circuits, wherein a plurality of static gate transistors are formed at selected intersections of rows and columns in an array, each row having a single gate conductor and each column forming vertical borders for the transistor source and drain regions formed therein. The columns are spaced from each other to provide spacing between horizontally adjacent transistors. A plurality of vertical conductors make connection to the source and drain regions and are insulatively spaced from the gate conductors. Law et al. however show only a logic array that is incapable of implementing dynamic logic functions.

Therefore, a need has arisen in the industry for a logic layout synthesis system that can implement functions with such non-Boolean components as dynamic domino gates, registers, buffers and precharge clocks with good final design density.

SUMMARY OF THE INVENTION

One aspect of the invention comprises logic circuitry including a plurality of logic circuits having Boolean portions and non-Boolean portions. The logic circuits are preferably described in RTL equations. The logic circuitry is formed at a face of the semiconductor layer, and comprises a logic array having a plurality of rows and columns. Gate transistors of the Boolean portions are formed in the array at selected intersections of the rows and columns. A tile section is formed at the face of the semiconductor layer and comprises a plurality of tiles, each tile comprising a non-Boolean portion of a logic circuit. Conductors are used to couple the Boolean portions of the logic circuit to the non-Boolean portions thereof.

A principal advantage of the invention inheres in its design style, in which transistors of random Boolean expressions are formed in a logic array and custom designed tiles for the different logic circuits are formed in a separate tile section.

In a further aspect of the invention, the conductors connecting the Boolean portions to the non-Boolean portions comprise a plurality of river-routed conductors. The conductors are preferably formed on multiple layers such that track density is maximized and the river routing section is of minimum height.

In a preferred river routing method according to the invention, a plurality of first terminals are assigned x- and y-coordinates in the array, and a plurality of second terminals are assigned x-coordinates in the tile section.

The first terminals may be deep within the interior of the array rather than merely on the edges thereof. The second terminals are preliminarily assigned a large, arbitrary y-coordinate before proceeding with the river routing design.

The first and second terminals are grouped in terminal pairs, and each pair is designated as either a first level type or a second level type. If a terminal pair is designated as a first level type, then a conductive lead river-routed between the terminals of this pair will occur primarily in a first level, such as polysilicon. If the terminal pair is designated as a second level type, then the river routing between the terminals of this pair will occur on the second level.

For terminal pairs of the first level type, segments of second level conductor may be used, such as metal conductors, in order to avoid array obstacles in the first level. Thus, where the first level is polysilicon and the second level is formed in a first metallization step, first metal may be used to route the conductive lead until the array obstacles to polysilicon routing have been passed, the routing thereafter being switched to polysilicon. Alternatively, the river routing can start at the first level, switch to the second level in order to avoid an obstacle to the first level routing, and then switch back to the first level after the obstacle has been circumvented.

As any conductive lead is routed from its first terminal to its second terminal, it will make a number of turns. After all of the river routing turns have been ascertained, the maximum y-coordinate of the river routing turns is used to determine the y-coordinate of each of the second terminals. This causes the river routing section thus created to be "squeezed down" from an arbitrarily large dimension in the y-direction to the minimum dimension required to effect the river routing.

For complex arrays, the river routing may be divided into a right block and a left block. The right block will preferably route the conductors toward the right until the x-coordinate of the second terminal of the corresponding terminal pair is reached, and the left block will preferably route the river routing conductors toward the left until this x-coordinate is reached. The river routing conductors for the rightmost block are routed with the rightmost conductor going first, and the river routing conductors for the left block are routed with the leftmost conductor being routed first. In this manner, there is no conflict between the river-routed conductors of the left and right blocks.

In another aspect of the invention, the logic circuitry includes a plurality of dynamic logic circuits each having non-Boolean circuit elements. Each dynamic logic circuit has a plurality of logic gate transistors that are each formed at a selected intersection of a row location and selected adjacent column locations in an array. A plurality of elongate gate conductors are formed at selected row locations or tracks in the array, with each gate conductor insulatively disposed over at least one of the logic gate transistors. A plurality of elongate second conductors are formed for coupling together the current paths of selected logic gate transistors. The second conductors further couple the array to non-Boolean elements of the dynamic logic circuits. Preferably, in the instance where several logic equations are implemented that use the same input signal or operand, a single gate conductor is provided that carries the value of the input signal and is used to gate respective gate transistors of each logic equation using the operand.

Another aspect of the invention comprises a plurality of tiles for the non-Boolean portions which are formed in a second portion of the semiconductor substrate separate from the regular logic array. The tiles are elongate and each present an end toward the columns of the logic array. The tiles are laid out in a columnar order that matches the columnar order of the Boolean portions of the logic equations as implemented into the logic array. This aspect of the invention provides a technical advantage in that the logic array and the tile section are tightly integrated with a river router. Further, the elongate shape of the tiles inside the tile section helps the tile section match as closely as possible the horizontal width of the logic array.

Another aspect of the invention comprises a method for laying out a plurality of logic circuits on a face of a semiconductor layer. According to this method, a Boolean portion of each logic circuit is mapped into a logic array on the face, the array having a plurality of rows and columns. The Boolean portion comprises at least one logic gate transistor formed at an intersection of one of the rows and one of the columns. Then, a non-Boolean portion of each logic circuit is implemented in a respective tile. The tile is placed in a tile section on the face near the logic array. Finally, a non-Boolean portion of each logic circuit is coupled with its respective Boolean portion.

Another aspect of the invention inheres in a design system that is able to derive a logic layout from input RTL equations. RTL equations define logic functions according to several types, including functions requiring one or more latches or dynamic domino gates. A computational method according to the invention is able to recognize each of these equation types and select appropriate non-Boolean circuitry for each. Thus, the input data can be more advanced and abstract than the prior art net list equations.

According to a further aspect of the invention, if any tile outputs an intermediate signal that is used as an input signal by other logic gates, the intermediate signal is fed back to the logic array on a conductor adjacent the tile. This arrangement is highly advantageous when compared to intermediate feedback signals in PLA layouts, which need to be routed half way around the layout perimeter.

In another aspect of the invention, the above method further includes the step of optimizing the logic array for dimensional compactness. The step of optimization preferably includes assigning an arbitrary row or track order to each of the input signals in the Boolean portions, one input signal per track, and assigning an initial columnar order to each of the Boolean portions. A cost function is preferably calculated for the present columnar order, based on criteria including logic array compactness. The Boolean portions are then reordered in a new columnar order, and the cost function is recalculated. The new columnar order is adopted as the present columnar order if its cost function has a better value, and is otherwise rejected. The steps of reordering, recalculating and adopting are repeated until a satisfactory cost function value is achieved. Preferably, the step of ordering is performed by a pairwise exchange heuristic.

The optimization aspect of the invention provides a technical advantage in that a compact logic array is achieved. One of the criteria that may be used in determining the cost function is the length of the gate conductors used to implement the logic array. Another is the degree from which the resultant order of primary inputs and outputs on the periphery of the logic circuitry differs from the optimum primary I/O order. Preferably, both of these criteria are used in optimizing the logic array structure.

In another aspect of the invention, the logic array may be horizontally folded after the columnar order of the Boolean portions of the logic expressions has been optimized. In folding, an array in which each gate conductor is accorded its own row location or track is compacted as much as possible such that two or more gate conductors may share a single track. This provides a shortened dimension of the logic array in the columnar direction.

A principal advantage of the above method is the ability of the implementation system to design non-static logic, and further, to freely mix static and non-static logic functions in accordance to a cost function.

Another aspect of the invention comprises a method for laying out a plurality of logic terms in an array of transistors having rows and columns, the terms generally oriented in a columnar direction and the transistors switched by signals carried by elongate conductors that are disposed in the rows. The transistors each have a source region and a drain region, and are each assigned a row index. A logic term will typically consist of one or more groups of transistors. Each group is composed of transistors having adjacent row indices. First, the transistor groups of the first term are laid out into a transistor array, with each transistor in a group being assigned the same column index as other transistors in the group and adjacent row indices. Next, the transistors comprising a second term are formed into a plurality of second groups.

A selected group in the second term, or second group, is compared with a corresponding first group from the first term. If the row indices of the transistors in the second group match those of the first group, a column index is assigned to the compared second group such that the source and drain regions of the transistors will be merged with respective source and drain regions of the compared first group. In this way, a technical advantage is obtained in that the spacing usually provided between transistors of different terms is eliminated, in the horizontal or row direction. The matching algorithm is preferably next applied to a next selected pair of first and second groups, so that horizontal merging between the source and drain areas of like transistor groups can be effected wherever possible. The method is then continued with a third term in relation to the second term, a fourth term in relation to the third term, etc.

In another aspect of the invention, the transistors in the logic array are laid out such that the first metal conductors connecting selected source and drain regions of the transistors contact the source or drain regions in corners thereof, and further have boundaries that are colinear with the boundaries of the source/drain areas of the transistors. A preferred method according to the invention formulates an array as comprising a plurality of point locations for transistors, each transistor point location having a column index and a transistor row index; a plurality of point locations for contacts, each contact point location having a column index and a contact row index; and a plurality of point locations for vertical metal or "first metal conductor segments, each first metal point location having a column index and a first metal row index.

The row index of each transistor point location is offset in a columnar direction from a corresponding row index of a gate conductor responsible for gating the transistor. The column index of any contact for contacting the transistor will either match the column index of the transistor point location or will be one column index displaced therefrom. The column index of any first metal conductor segment used to connect to a transistor will match the column index of the respective contact.

The row index of each first metal segment matches a corresponding row index of a gate conductor, and the row index of any contact point location is offset from any one gate conductor row index.

From each transistor point location, a source/drain diffusion area is constructed that extends in a columnar direction to include a respective gate row index and a pair of contact row indices, one to each side of the gate row index. The diffused area extends in a row direction through two column indices.

Preferably, for any one transistor, potential contact points will occur in each corner of the transistor. The width of the first metal conductor segments constructed from the first metal point locations is such that the vertical boundary of the first metal conductor will be colinear with at least one transistor source/drain diffusion area that it is provided to connect.

A principal advantage of this layout method is its efficient use of space in laying out transistors, contacts and first metal conductors. Contacts are made to corners of the transistors, rather than the center of the source and the center of the drain. In this way, multiple contacts can be made to any one transistor. Further, the vertical boundaries of the first metal conductors are aligned to the vertical edges of the transistors, thus saving further space.

A further advantage of the invention is obtained by the preferred compact two-level river routing that further allows the river routing conductors to switch back and forth between conductor levels in order to avoid array obstacles.

Another advantage of the invention is the relatively compact design produced, which design is moreover free from design flaws. Inside the Boolean logic array, the transistors and connections thereto may all be standardized according to design rules. For the non-Boolean elements, customized tile or register sections are used that have been previously designed and tested.

BRIEF DESCRIPTION OF THE DRAWINGS

Further aspects of the invention and their advantages will be ascertained with reference to the following detailed description in conjunction with the drawings in which:

FIG. 1 is a schematic electrical circuit and layout diagram showing a preferred layout topology employed by the invention;

FIG. 3 is a listing of logic equation inputs used by an automated program according to the invention to generate exemplary control logic circuitry;

FIGS. 4a and 4b are listings of logic equations and their input signals showing a final two-dimensional symbolic array after logic array optimization and folding;

FIG. 5 is a schematic block diagram of a completed exemplary layout according to the invention, showing a logic array section, a lower tile section, an upper tile section and river routing therebetween, all as generated from the symbolic array shown in FIGS. 4a and 4b;

FIG. 6 is a detailed magnified schematic plan view of the random logic array section and river-routing sections shown in FIG. 5;

FIGS. 10a–10c are charts of the locations of transistors, transistor contacts and first metal conductors in respective symbolic arrays as stored in a computer memory;

FIGS. 11a–11c illustrate steps in the laying out into a logic array of transistors for two adjacent logic terms;

FIGS. 13a and 13b are graphs showing the states of an exemplary two-dimensional polysilicon-level river routing array (POLY RR ARRAY) and a corresponding first metal river routing array (1MET RR ARRAY) at an early stage in a river routing sequence;

FIGS. 14a and 14b are graphs showing POLY RR ARRAY and 1MET RR ARRAY at an intermediate stage of the river routing sequence;

FIGS. 15a and 15b are graphs showing POLY RR ARRAY and 1MET RR ARRAY at a further stage of the sequence.

DETAILED DESCRIPTION

Figure 7:
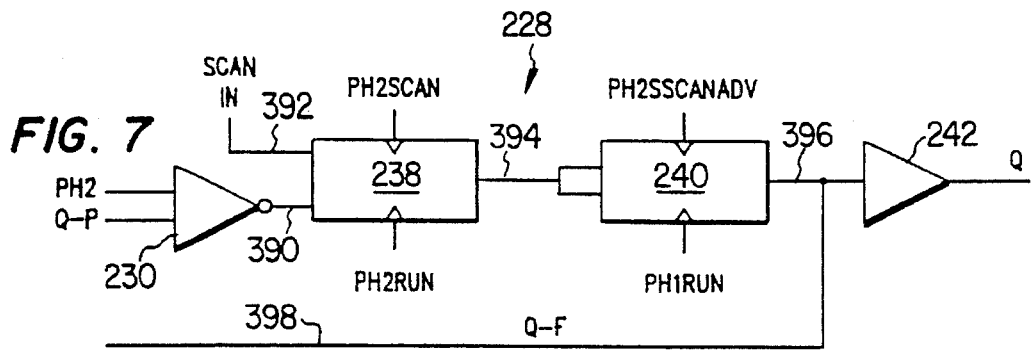
FIG. 7 is an electrical circuit block diagram of a non-Boolean logic tile incorporated into the tile section shown in FIG. 5.

FIG. 1 is a part-electrical, part-physical schematic diagram of a general layout topology according to the invention. An extremely simplified logic circuit is indicated generally at 10. Logic circuit 10 has been implemented at a face of a semiconductor layer 11. Circuit 10 implements a static gate logic equation S=AB, and an analogous dynamic gate logic equation D=AB. A plurality of logic gate transistors 12–24 are laid out in a regular manner in a random logic array section 26, and a plurality of related non-Boolean elements 28–42 are formed in a plurality of tiles 43–47 and 49 within a tile section indicated generally at 48. Tiles 43–47 and 49 are connected to selected points in the random logic array 26 by a plurality of river-routed conductors 50–62.

The general organization of logic array section 26 is as follows. For the inputs signals or operands A and B of of logic equations S and D, and for feedback and clock functions, a plurality of horizontal gate conductors 64–76 are disposed in a plurality of predetermined rows or tracks in the array. The gate conductors 64–76, which preferably are comprised of polycrystalline silicon, are disposed adjacent diffused regions (not shown) that are formed at selected columnar indices in the array. The diffused regions are shaped and sized according to predetermined design rules.

At each of these intersections a transistor is formed, such as transistors 12–24. Both n-channel transistors, such as transistors 12, 14, 20, 22 and 24, and p-channel transistors, such as transistors 16 and 18, can be formed within array 26. The illustrated embodiments shown in FIGS. 1, 6, 6a–6e and 8 are for CMOS technology, although NMOS or PMOS technology could also be used. Where the basic conductivity type of the semiconductor substrate is p-type, the p-channel transistors 16 and 18 are formed in an n-tank 78.

In general, the gate transistors making up any particular logic function, such as transistors 12 and 14, are disposed wherever possible in columnar relation to each other. Boolean portions of the logic equations are mapped into the array in a left-to-right order. In this extremely simple case, a Boolean circuit for equation S is disposed generally in the left side of the array 26, and a Boolean circuit for dynamic AND logic equation D is disposed generally on the right hand side of array 26.

Although the gate transistors of the logic equations are in general vertically disposed in relation to each other, many, if not most, of the implemented Boolean logic circuits will take up several columnar indices of space. Thus, for expression S, a pair of n-type transistors 12 and 14 are disposed in a first column indicated generally at 80. A p-channel transistor 18 is disposed in a second column indicated generally at 82, and a further p-channel transistor 16 is disposed in yet another column 84. A preferred automated layout-generating computer program responsible for generating the layout further takes into account additional columnar spacing requirements imposed by n tank 78.

The transistors occupying various columns 80–84 of logic expression S are connected together by conductors 86–100 that run on a different level than, and are substantially orthogonal to, conductors 72 and 74. In the illustrated embodiment, conductors 86–100 are formed from elongate strips of first metal that are usually insulatively spaced over polysilicon conductors 72 and 74, as by a layer of interlevel oxide.

In each transistor diffused region, vias are made to the semiconductor substrate for the connection of first metal conductors on either side of the gate conductor. Although conductors 86–100 are disposed vertically in specified columnar indices, the computer program that embodies the preferred design process of the invention will make horizontal connections in the first metal based on the logic expression involved. Examples of such horizontal first metal connections are horizontal conductor segments 104, 106, 108 and 110.

Logic expression D is of the dynamic domino type, wherein the first metal conductors are first precharged by a precharge clock located in tile 46, and then are discharged depending on the presence or absence of signals on gate conductors 72 and 74. Dynamic logic expression D is implemented by a plurality of transistors 20–24 that are in this instance disposed at a single columnar index indicated generally at 112. First metal conductors 114 and 116 interconnect the current paths of transistors 20–24 in series. A river-routed conductor 60 connects a drain of transistor 20 to circuitry tile 46, and a further first metal conductor 118 connects a source of transistor 24 to ground. Transistor 24 implements a discharge clock DCLK of expression D within logic array 26, while a precharge clock of expression D is implemented within the corresponding tile 46.

The non-Boolean components implementing logic expressions S and D are placed in respective custom-designed tiles 44 and 46 within tile section 48. For static logic expression S, a river-routed conductor 54 connects to the logic matrix circuit portion of expression S to the input of inverter 28. The output of inverter 28 is connected to a node 29, which in turn is connected to the input of an inverter 30. The output of inverter 30 is connected to a node 31, which in turn is connected to the input of a buffer 32. Buffer 32 outputs a buffered output signal S on an output conductor 120.

The river routing technique also allows the feedback of signals S and $\bar{S}$ from nodes 29 and 31 on feedback conductors 52 and 50 respectively. Thus, the result of a logic operation on input signals A and B can be fed back into logic array 26 for further operations. The signal feedback conductors 50, 52, 56 and 58 are part of a preplanned routing scheme and are disposed adjacent the circuitry making up tiles 44 and 46. The design technique of the invention allows the reintroduction of the feedback signals into logic array 26 without routing the conductors half way around the array to some input section, as is the case for the PLA design technique. River-routed conductors 50 and 52 make appropriate connections to gate conductors 64 and 66, which make S and $\bar{S}$ available as input signals for further logic expressions.

Expression D evaluates the NAND of input signals A and B, but does it with a dynamic domino circuit. The source region of transistor 24 is connected by a vertical first metal conductor 118 to a ground line 122. A p-channel precharge clock transistor 42 is formed within tile 46. This transistor energizes conductor 60 as long as the signal on line 62 is low. A p-channel transistor 40 selectively connects a voltage supply VCC to conductor 60. The signal on conductor 60 will be inverted by inverter 38 and will appear on a node 124. Thus, if conductor 60 is high, node 124 will be low and will cause conductor 60 to be brought up to a full voltage level.

The signal at node 124 is transmitted back into the logic matrix 26 by a river-routed conductor 58, where it makes connection to a horizontal poly gate conductor 68. The signal is once again inverted by inverter 36, and the complement signal D is brought back into the random logic array 26 by a river-routed conductor 56, which in turn makes connection to a horizontal gate conductor 70. Finally, the signal is fed into an output buffer 34, and is made available on a primary output line 126.

A further plurality of river-routed conductors 90, 118 and 128 connect respective Boolean circuits disposed in logic array 26 with a lower tile section 130. Tile section 130 is in the illustrated embodiment comprised of a ground line 122 and a voltage supply line 134. Other non-Boolean circuit elements can also be disposed in lower tile section 130, such as clocks and inverters not associated with output buffers. Further non-Boolean circuit elements of a kind normally disposed in upper tile section 48 can be placed in lower tile section 130 according to space considerations. In this way, a closer matching to the horizontal width of the Boolean logic matrix 26 can be attained in the layout of the non-Boolean elements associated therewith.

Note that the tile 44 for static logic expression S and the tile 46 for dynamic logic expression D are sited inside tile section 48 in the same left-to-right order that the gate transistors comprising the Boolean circuits for S and D are sited inside random logic array 26. Since the Boolean circuits for functions S and D are preferably placed in an order that best matches the preferred peripheral locations of circuit 10's primary inputs and outputs, and since tiles 44 and 46 match this order, the complexity of making connections to circuit 10 is minimized.

Figure 2:
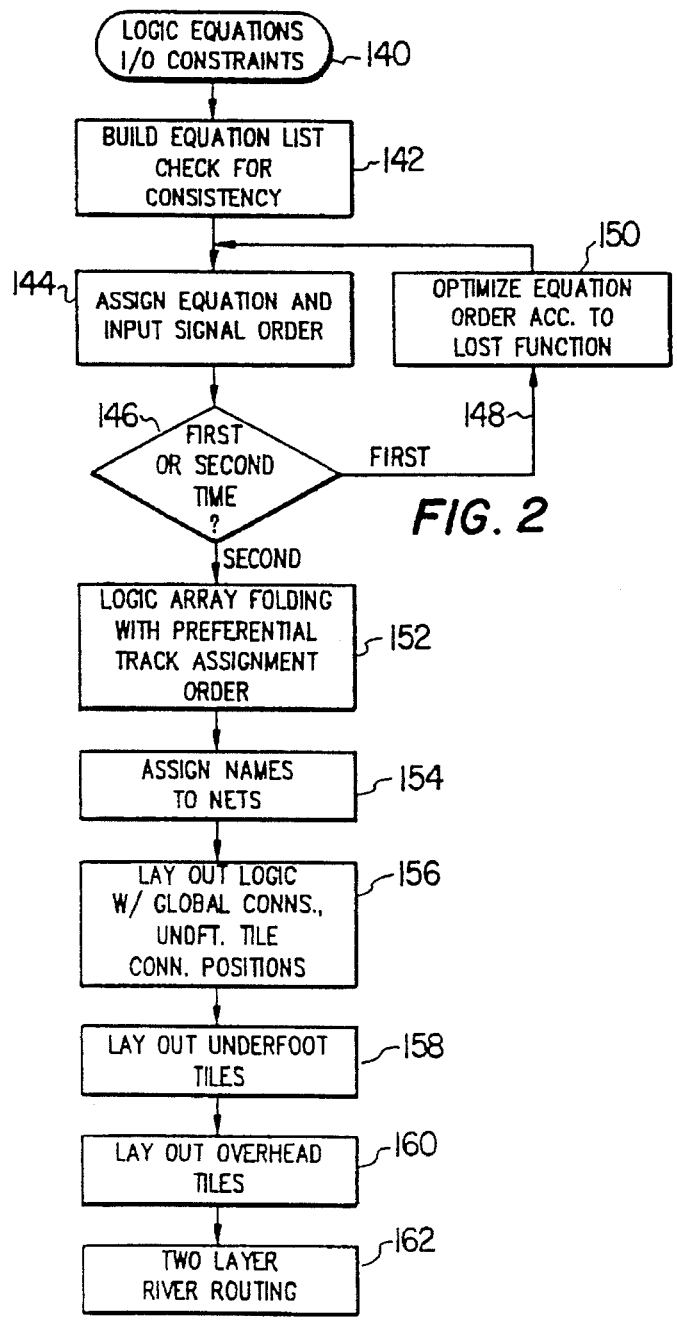
FIG. 2 is a flowchart of a preferably automated layout synthesis process according to the invention.

Turning now to FIG. 2, a flowchart showing the sequence of steps employed according to the method of the invention is shown. In a preferred embodiment, most of the steps of the method are incorporated into a computer program. However, the method could also be accomplished manually.

An overview of the method of the invention will be described in conjunction with FIG. 2. As inputs into the process, a plurality of logic equations or expressions are provided at an initialization step 140. These are preferably in the form of RTL expressions. Each logic equation will have one or more inputs and a desired output. Further, the inputs and outputs of any particular equation may be constrained to appear at a selected point on the periphery of the control logic layout. These input/output constraints are identified with the respective logic equations and are used in subsequent steps of the method.

In a next step 142, a list of the logic equations originated in step 140 is built, and the list is checked for consistency. Each expression is identified according to its type. For instance, there can be static gate equations, registered equations, and dynamic domino logic equations. The registered equations and the dynamic domino logic equations may further be differentiated according to the identity of the clock source on which they are operated.

The method then proceeds to a step 144 which assigns an initial order to the equations, given due regard for the input/output constraints input at step 140. The equation order is conceptually the order of the equations as reproduced in the logic array 26 (FIG. 1), and is a left-to-right order. A signal order is also initiated at this step, the signals being arbitrarily assigned each to a single row or track in the logic array.

At decision point 146, the method asks whether the equation order has been assigned for a first or second time. If the equation order has been assigned for the first time, the program branches on a path 148 to a step 150. In step 150, the equation order is optimized according to a cost function. In this step, each equation is analyzed with respect to its current position inside a symbolic logic array. A cost is assigned to this implementation of the expression according to various selected design criteria, such as those relating to logic array layout area and peripheral interconnection complexity. In the illustrated embodiment, a gate conductor length variable and a primary input/output order are used to assess relative compactness and simplicity of the entire design, as will be described in more detail below.

An input signal, as carried on a single horizontal gate conductor or track, may be used in two or more Boolean circuits or branches thereof. If the Boolean circuits are situated next to each other, the length of the gate conductor can be relatively short, as only the horizontal distance between the farthest two columnar indices of those two logic equations needs to be bridged. If, on the other hand, the two logic equations using this one signal are on opposite sides of the symbolic logic array, the gate conductor length for the input signal that is mutually used by them will be long.

The length of the gate conductor involved is also a measure of the amount of that track that is taken up by that particular gate conductor. If a short length of gate conductor is used, the remaining portion of the track may be used for another gate conductor in a subsequent folding step. If, however, a long gate conductor is used, then the use of that particular track by another gate conductor will not be possible.

Another variable used in the optimizing process is the departure of the primary input/output order from the optimum order. The logic circuitry implemented in one tile section and associated logic array may only be a portion of the circuitry implemented on the chip. The primary inputs and outputs connect the logic circuit block implemented by the program to other components on the chip. Based on the physical relation of these other components to the logic circuit block, the primary inputs and outputs will have optimum entrance and exit points on the top, bottom or sides of the block.

As the order of the RTL logic expressions is shuffled inside the logic block, the entrance and exit points of the primary inputs and outputs will change order. Any departure away from the optimum order increases the cost in area and complexity in connecting the designed logic block to the other components.

The equations are exchanged within the symbolic array in a pairwise exchange heuristic algorithm (to be described in more detail below), and a new value for the cost function of the reordered symbolic array is then calculated. This optimization loop continues until a minimum further improvement in the cost function is obtained.

After step 150 is completed, the equations are once again assigned and ordered at step 144. Step 144 leads back to step 146, which tests again whether this order assignment is for the first or second time. Since this is the second assignment of order time, the program branches to step 152.

In step 152, the symbolic logic array is examined to see whether it can be vertically compacted, that is, compacted in a columnar direction. The gate conductors at this point have been optimized to their shortest lengths given the Boolean circuit requirements of the logic equations and their input/output constraints. As such, these gate conductors may occupy only a small fraction of the particular horizontal track which they initially occupy. The array is therefore restructured or folded, and available empty spaces on certain tracks are "filled" with symbolic gate conductors transferred from other tracks. Thereafter, several symbolic gate conductors will occupy the same track, as spaced from each other end to end.

The method next proceeds to step 154. Equations much more complex than those shown in FIG. 1 may be implemented using the layout method of the invention. Therefore, complex logic equations are broken down into factor expressions. Step 154 assigns names to these factor expressions, or "nets," which yield intermediate results for use in other logic equation branches. Names are given to these "nets" together with vertical and horizontal indices for later connection to upper or lower tiles.

In the next step 156, the symbolic logic array is laid out according to given design rules and the finalized and folded equation order and input signal order. Global connections to other portions of the integrated circuit are laid out, as are connection positions to those tiles that are situated below the logic array, or so-called underfoot tiles.

In step 158, the underfoot tiles are laid out given the underfoot tile connection positions established in step 156. As previously explained, the underfoot tile section will typically comprise inverter, buffer and simple register tiles. The underfoot tiles are preferably chosen such that their inputs and outputs are not primary inputs and outputs, but rather are intermediate signals or "nets". The underfoot tiles are laid out in the same order as the order of respective Boolean logic portions of the equations implemented in the logic array 26.

In step 160, the remaining non-Boolean circuit portions of the logic expressions are laid out in overhead tiles. The overhead tiles are laid out in the same left-to-right order as respective Boolean portions of their logic equations. Each tile may have subcomponents arranged vertically, as will be further described for FIGS. 7 and 8.

Finally, in step 162, both the overhead tiles and the underfoot tiles are connected to the logic array by means of a preferably two-level river router. The river router employs both polysilicon and first metal conductors. The river routing terminals in the logic array originate from various y-coordinates therein to take advantage of free space within the logic array between gate transistors. The river routing will 11 be more particularly described in conjunction with FIGS. 5, 6 and 12–16.

With the above overview in mind, details of the various steps of the method will be described. In FIG. 3, a logic equation input list for an exemplary layout is shown. The illustrated list is in a form suitable for use as input data for a computer program. This computer program, called RESCUE, is the preferred means of carrying out the subsequent steps of the invention, although the method could be accomplished in whole or in part by hand, or by another computer program.

The list is in RTL format. One of the advantages of the invention arises from the fact that logic circuitry can be laid out using RTL equations as inputs. RTL i s a high-level, abstract language that allows the description of both Boolean and non-Boolean attributes of a logic gate in a single equation. Expressing logic in RTL can be done in a much more compact fashion than other logic languages such as "net-list".

In FIG. 3, the logic equations to be implemented are listed under the RTL heading DEFLOGIC. Each equation is defined in terms of its signal name, type, activating clock (if the expression is of the dynamic type), and its input signals. A first type of equation i s DEFLATCH, as shown for example at 170, indicating that the equation is of the latched dynamic domino type. The equation name is AL, shown at 172. The name of the clock used to energize the DEFLATCH equation is PH2, shown at 174. Finally, a series of eight input signals that are all inputs into this logic equation are shown at 176. A double slash before an input signal name, such as //EX, indicates that the inverse of the signal is used.

DEFLATCH is a type of dynamic domino gate equation that stores its equation result in a latch, which is part of a register. The tile corresponding to this particular equation will therefore include a sense amplifier or a dynamic precharge clock as well as a latch. All defined equations require an output buffer which, therefore, will be situated in an appropriate tile for that equation.

A static gate logic equation is shown at 178, as identified by DEFEQN. The names of these particular equation types adopted are entirely arbitrary so long as they are distinguished from each other. Static equation 178 has a signal name L. No clock is associated with it, and thus, the equation description starts immediately with three input signals shown at 180. The three input signals are ANDed together. DEFREGISTER Q, at 182, shows a Boolean combination of OR and AND operations. Input signals R and J are ORed together, as are signals Q and U. Note that one of the input signals of DEFREGISTER Q is Q itself, requiring the feedback of this particular output signal into logic array 26. The clock specified for DEFREGISTER Q is PH1RUN. A DEFREGISTER equation has two latches that need to be implemented in a respective tile, and PH1RUN clocks the first of these. The program will select an alternate run clock, PH2, as the domino discharge clock to be implemented in the logic array.

Another illustrated equation type is DEFCLOCK, as for instance DEFCLOCK V indicated at 184. This is a logic equation of the dynamic domino type that requires a clock. The particular clock used here is PH1, as indicated at 186. A DEFCLOCK type of equation, however, does not need a latch, and thus, its tile will contain a sense amplifier and buffer only.

At 187, a DEFCLOCKL equation having an output signal name AH is listed. A DEFCLOCKL is an RTL equation type that requires the implementation of a gated clock and a latch in a non-Boolean tile. DEFCLOCKL AH specifies a clock signal PH1RUN, which will be used to switch the gated clock. The program selects an alternate run clock, PH2, for clocking a discharge gate in the logic array.

A final illustrated equation type is termed DEFSCANADDREG, as for instance i s shown at 188. An equation with this designation is a portion of a parallel scan chain that i s incorporated into the upper tile section.

Note that many of the logic equations are interconnected, since the result of one equation may be used as the operand of another equation. For example, DEFEQN L shown at 178 produces a result L that is used as an input signal at 190 in the generation of an equation DEFLATCH LL.

The dynamic types of equations above illustrated may further be differentiated by the clock used to activate them. Thus, there may be two or more types of DEFLATCH equations, and two or more types of DEFCLOCK equations. In general, the use of the various equation type names provides a key to the computer program as to what is required to implement the equation, both in terms of Boolean logic operations in array 26 and the contents of associated tiles in the tile sections 48 and 130 (FIG. 1).

The logic equations illustrated in FIG. 3 have been checked for consistency; equation results used in further equations have been identified, and extraneous, unused equations have been removed. The latter happens when several logic arrays and associated tile sections are fabricated at the same time, wherein a choice of several inputs can be made to implement any particular logic equation. FIG. 3 also lists the output terms by their variable names, in their preferred output order, and further the required input terms in an initial order. The input data set illustrated by FIG. 3 can further specify which inputs are from an overhead datapath, which inputs are from bondpads, and which outputs go to bondpads. These additional data are not shown.

A preferred algorithm according to the invention takes the input data shown in FIG. 3 and first assigns each input signal shown in the equations an arbitary horizontal track order, initially equations one operand per track. After beginning numerical indices are have been assigned both to the initial equation order and input signal order, an array optimization step is next employed according to a cost function. The equations are ordered in a one-dimensional array as follows:

$$Eq_1, Eq_2, Eq_3, \ldots Eq_J, Eq_{J+1}, \ldots Eq_{J+D}, \ldots Eq_n,$$

where $Eq_i$ is the ith equation in an array of n equations.

A cost function is originally determined for the original equation order. One such cost function C may be expressed as follows:

$$C = \sum_{i=1}^{n} l_i^2 + w \sum_{j=1}^{m} (Do_j)^2$$

In the above cost function, n is the total number of horizontal input signal tracks required to implement the logic array in the desired order; $l_i$ is the length of the ith track; W is a scalar weight to be attached to the ordering cost relative to the horizontal track cost; m is the number of input and output signals; and $Do_j$ is the signal ordering cost for the jth input or output. $Do_j$ may be quantized as the number of places that a primary input or output j is displaced from its preferred position in the currently considered configuration.

After an initial cost C is obtained, a pairwise exchange heuristic algorithm is employed in order to attempt to reduce the value of the cost function as far as possible. Starting with the original equation order indicated in FIG. 3 above, pairs of equation are switched in their left-to-right order in the symbolic array, and the cost function redetermined. The first loop in this exchange procedure is to exchange equation J with equation D from (⅔)n down to one. Variable J is initially selected as one, and D is initially chosen preferably as equal to (⅔)n, where n is the total number of equations. These two equations are then exchanged, and the cost function recalculated. If new value of C is less than the current value of C, the switch in order is made permanent. J is then incremented to two and D is incremented to D+1. This process repeats until D+J is equal to expression n.

During the next pass, the difference between D and J is reduced by one, and the process repeated. Subsequently, D is slowly reduced to one as the algorithm runs. This heuristic procedure promotes clustering at the beginning and does local optimization toward the end. The procedure is then repeated with a smaller initial D until no further cost reduction is obtained, or until the improvement in cost reduction goes below a predetermined minimum.

Turning now to FIG. 4a, a two-dimensional symbolic array corresponding to the logic array to be implemented (FIG. 6) is shown. The equivalent of this array is produced, preferably by a computer, after the optimum equation order has been determined by the above-described pairwise exchange heuristic algorithm and the input signal folding step (described below) has been accomplished. The array illustrated by FIG. 4a is a human-readable version of the data actually stored in the computer. A two-dimensional array is plotted out with the gate conductor tracks proceeding from top to bottom, and the input/output conductors proceeding from left to right. In the final physical array, the gate conductor tracks are disposed horizontally.

The array in FIG. 4a has 34 left-to-right columns, each associated with an output signal name. The array further has 15 top-to-bottom rows that each correspond to a possible numerical gate conductor position. The location of transistors or first-metal-conductor-to-poly-track contacts in the symbolic array are indicated by "1"s, "I"s, "∅"s and "O"s. The gate conductor tracks in between the transistors and contacts are represented by exclamation points. In each position where a dash appears, no gate conductor or transistor is formed.

The symbolic array in FIG. 4a shows the numerical, two-dimensional order of the array before the physical attributes of the logic array, such as transistor pitch, conductor widths, spacing, etc. are considered. As an example, one gate conductor track has been circled at 200. Gate conductor 200 begins in column 18 and ends in column 30. A first transistor is formed at column position 18. A contact to a first metal conductor is formed at column position 27. A last transistor is formed at column position 30. The entire gate conductor 200 is disposed in a track No. 5, which also contains another gate conductor for a different input signal or operand.

The transistor and contact symbols are coded according to whether they are the last transistor or contact on the respective poly track, and further according to whether an input signal or its inverse is used. Conductor 200 uses a non-inverted input signal, and thus, the transistors and contacts thereon are represented by "1"s and "I"s. The first transistor and the contact are represented by the numeral "1"s, and the last transistor is indicated by an "I". A gate conductor that uses an inverted input signal or operand is shown circled at 202. This conductor runs from column position 8 to column position 17. Two transistors are formed over its length, at column positions 13 and 17. A contact to first metal is made at column position 8.

Conductor 202 occupies track position 8 which it shares with another conductor spaced therefrom. For gate conductors using inverted input signals, the first and intermediate transistors and contacts are indicated by "∅"s and a last transistor or contact on the poly track is indicated by an "O".

Each column 0–34 represents an initial first metal vertical or columnar track order position. At each columnar position, a preferably first metal conductor may be provided for the interconnection of one or more transistor current paths in that column. In Column 2 for example, a conductor termed Q DEFREGISTER OUT FIRST-OR-TERM makes connections to transistors at track positions O, 3 and 4. Note that the fabrication of an OR term takes two columns: a second OR-TERM for signal Q is disposed in column 3, and makes corrections to transistors at track positions 6 and 7.

The procedure has by this point distinguished between the original logic equations or signals and such variations of them as are necessary to be implemented in individual columnar conductor tracks. Thus, at column positions 10 and 11, two variations of signal AH are shown. Both are outputs from the logic array as indicated by the code "OUT". In Column 10, a FIRST-OR-TERM conductor for signal AH makes connections to transistors at track locations O, 1 and 4; in column 11, a LAST-AND-TERM conductor for signal AH makes connections to transistors at track locations 6, 7 and 9. The FIRST-OR-TERM and LAST-AND-TERM cods determine how the connections to the transistors will be made in the physical array, and the relationship of the two AH conductors to each other. AH DEFCLOCKL LAST-AND-TERM will actually make further connections to the transistor located at column 10, tracks 1 and 4, but these transistors have already been specified as attributes of AH DEFCLOCKL FIRST-OR-TERM.

Equation Q has been implemented in column positions 2 to 4. The DEFREGISTER legend on columns 2 and 3 indicates that the columns are used to construct a Boolean portion of an equation that includes two latches in a tile. The OUT legend on column 2 indicates that this columnar conductor carries a primary output. The FIRST-OR-TERM legend indicates that this is the first column used to implement a first of the two OR expressions (in particular, R+J; see FIG. 3) used to define equation Q. Column 3 is used to define another branch or OR-TERM of this equation.

Column index 5 is occupied by a columnar conductor carrying signal R. The TRUE legend indicates that this input signal is uninverted. The FROM-TOP legend indicates that this signal proceeds directly from the top of the tile section as a primary input.

At column index 8, signal ML is indicated as having been inverted by the NIL legend. The NIL-FROM-BOTTOM and CBINV legends indicates that a columnar conductor segment in this column position is connected from an inverter located in a bottom tile section. This conductor makes a contact to a gate conductor at 202 on track 9.

The remaining column indices are occupied by other columnar conductors having similar designations as to their signal source and type and whether the signal is inverted.

In the illustrated example, rows 0–9 are occupied by various horizontal gate conductors of a first gate array with transistors disposed along the lengths of the horizontal tracks at determined positions. FIG. 4a also shows a second array whose sole horizontal conductor track is shown on row 15. The second array is used to connect selected overhead tiles with each other and does not decode any Boolean logic. The second array is usually formed as a plurality of second metal row tracks that connect to two or more columnar first metal conductors.

In row 15, the "1" indicates a first connection by a first metal conductor to a second metal horizontal track, and the 'I' represents the last connection to the second metal track. The second array is disposed as closely to that tile section containing the tiles it connects as possible. This tile section is conceptually off to the right of the symbolic array.

In the symbolic array shown in FIG. 4a, the second array is arbitrarily distanced from the main logic array by a number of empty rows 10–14. The mapping of this second array outside the overhead tile section 48 (FIG. 1) gives an advantage in providing a router between overhead tiles without the redesign of those tiles. The second array may be folded like the first, logic array, such that two or more second metal horizontal conductors may be disposed on the same horizontal track. While the illustrated second array uses only one horizontal track, as many tracks as are necessary may be used.

FIG. 4b illustrates the rest of a human-readable version of the symbolic array that is preferably stored in the computer at this point. It is a listing of the input signals carried by the gate conductor and second metal conductor tracks that are shown in FIG. 4a. Thus, for example, at track position 4, an input signal R starts at column index position 2. This horizontal track position is also shared by an inverse of input signal H, the gate conductor for which starts at column index 10. Thus, the listing shown in FIG. 4b identifies each gate conductor represented in FIG. 4a. The last horizontal track, 15, is a second metal track that carries a signal N. This track is in the second array.

FIGS. 4a and 4b together illustrate the use of input signal folding, wherein several input or operand signals occupy the same horizontal track index. At gate conductor track O, a gate conductor for input clock signal PH2 runs almost the entire length of the logic array from a transistor at column index 2 through a transistor at column index 33. At track 7, a gate conductor for input signal Q shares the track with gate conductors for input signals LL and I. One module of the program looks for opportunities to "squeeze" or "fold" the array gate conductors once the equation order have been finalized. Thus, the gate conductors for input signals Q, LL and I originally occupied different symbolic tracks. The program recognizes that no overlap in columnar position occurs among the gate conductors fair these three input signals, and therefore "folds" them into one track.

The folding step is preferably performed as follows. The gate conductors are first segregated into four groups: conductors that are constrained to occupy preselected track indices and cannot be moved to another track; conductors that are preferentially placed near the bottom of the logic array, such as those carrying discharge clock signals for dynamic logic equations; conductors that are preferentially placed near the top of the logic array near the overhead tile section, such as conductors carrying so-called "precharge through" signals that arrive earlier than normal; and the remainder of the conductors. The track-constrained conductors are next placed into the symbolic array.

The bottom-preferring conductors are then sorted according to their length. The longest bottom-preferring conductor is placed on the bottommost available tract. The bottommost available track is one which has no track-constrained conductor in it that overlaps or intersects the columnar indices of the longest bottom-preferring conductor. In deciding whether there is an intersection of conductor columnar indices, provision is made for spacing the conductor ends apart.

Then, the second longest bottom-preferring conductor is placed. If this conductor has no columnar intersection with either the longest conductor or any track-constrained conductor occupying the bottom track, then it is placed on the bottom track. If an intersection on the bottom track exists, then the program searches for the next lowest track that has sufficient space for this second-longest conductor. This process repeats for the third and subsequent bottom-preferring conductors, filling the logic array from the bottom toward the top.

Next, the top-preferring conductors are placed in the array in a similar manner, but this time from the topmost array track to the bottom. Finally, the remaining gate conductors are placed into the array using a procedure similar to that used for the bottom-preferring and the top-preferring conductors. The direction of fill for the remaining conductors may be either top-to-bottom or bottom-to-top. If there are any unoccupied tracks in the middle of the array after this step, they are eliminated.

Once the symbolic array represented in FIGS. 4a and 4b has been obtained, actual physical design parameters and rules are applied to the symbolic array to produce a plan design of a corresponding physical logic array. These physical parameters include transistor size and spacing, contact spacing, conductor widths and tank dimensions. The logic array is then plotted out. Preferably, the symbolic array shown in FIGS. 4a and 4b is used as a basis to form three further arrays within the computer memory: a transistor array (TRANARRAY) for defining the limits of transistor sources and drains, tanks and gate conductors, a contact array (CTORARRAY), and a first metal columnar conductor array (MET1ARRAY).

Figures 10A, 10B, 10C, 11A:
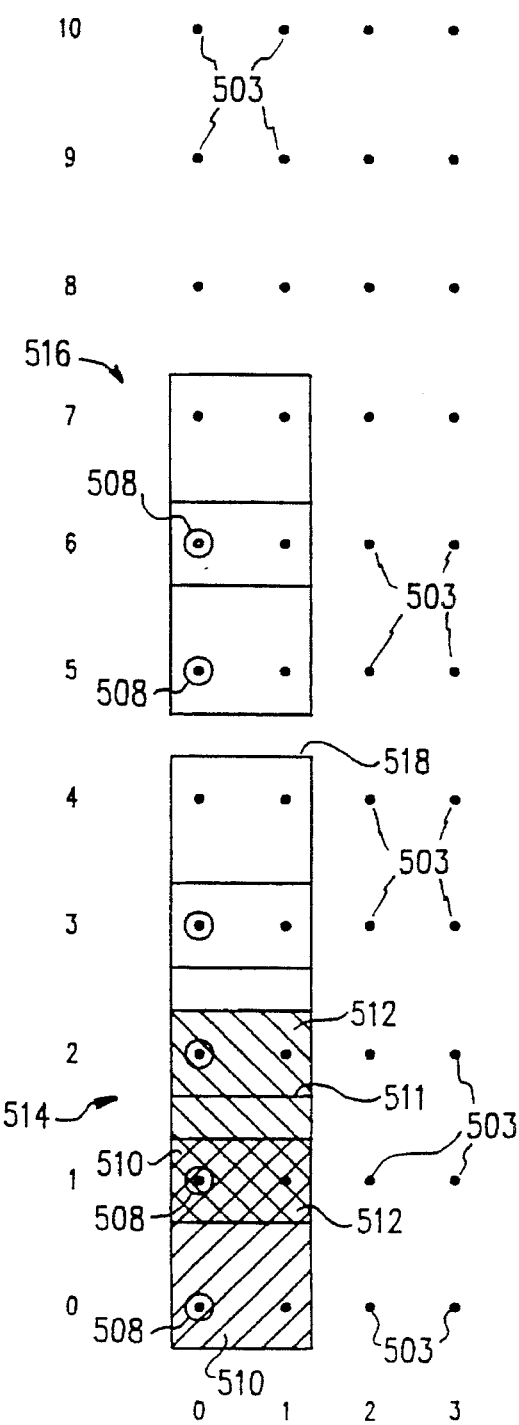

TRANARRAY, CTORARRAY and MET1ARRAY are illustrated for a very simple case in respective FIGS. 10a–10c. Referring first to FIG. 10a, TRANARRAY stores a plurality of transistor source/drain diffusion areas as point locations in a matrix. Each point location in TRANARRAY has a row index and a column index. In a like manner, point locations representing the physical location of contacts in the logic array are stored in CTORARRAY (FIG. 10b) and point locations representing first metal conductor segments are stored in MET1ARRAY.

Figure 9:
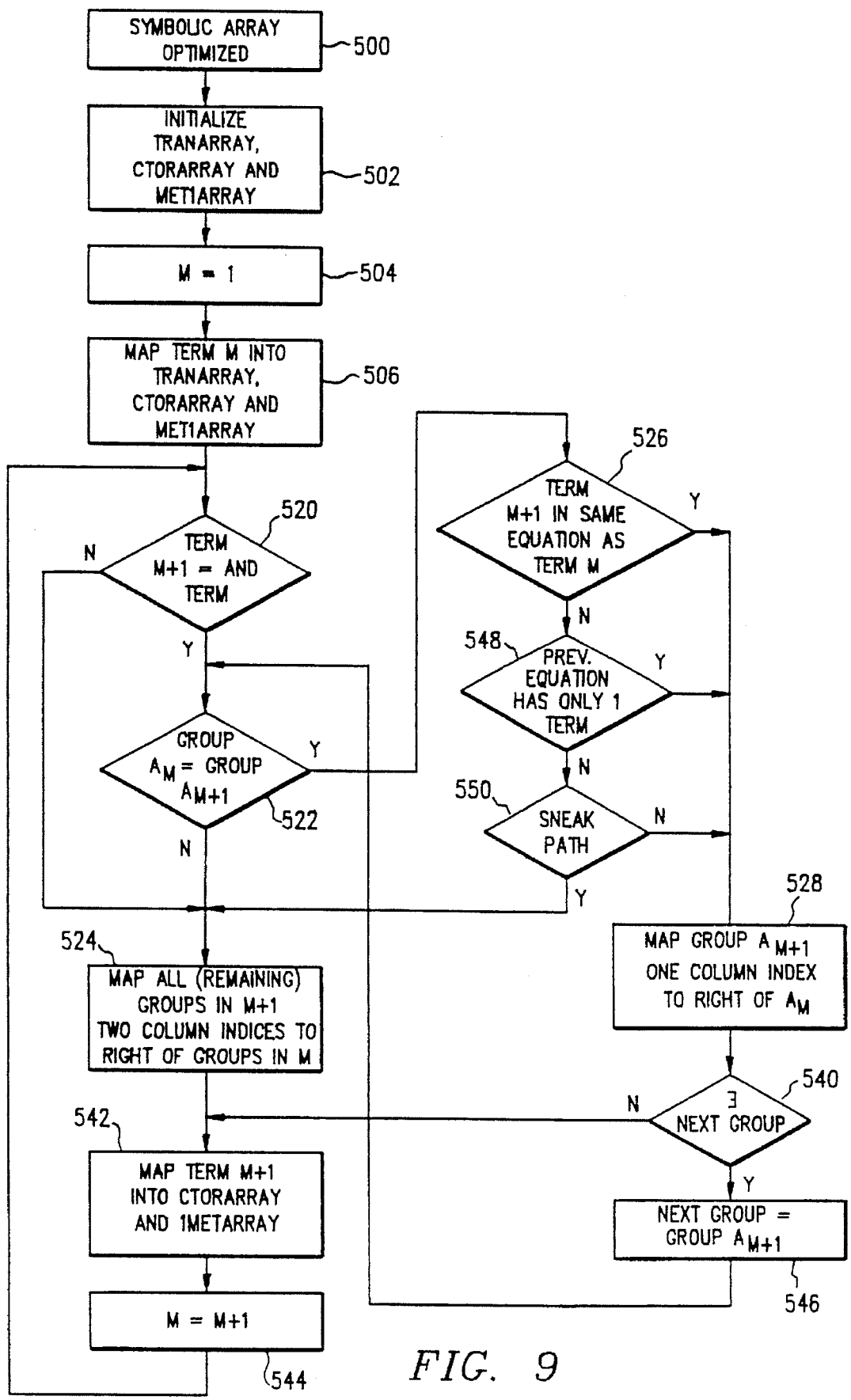
FIG. 9 is a flowchart of a logic array layout algorithm according to the invention.

The point locations in the TRANARRAY, CTORARRAY and MET1ARRAY matrices are laid out, column by column, according to a method illustrated by the flow chart in FIG. 9. At step 500 in FIG. 9, the symbolic array is optimized with respect to the location of the polysilicon tracks. A human-readable form of an optimized array is shown in FIGS. 4a and 4b. Step 500 occurs as a result of step 151 in the flow chart shown in FIG. 2.

At step 502, TRANARRAY, CTORARRAY and MET1ARRAY are initialized to define a plurality in potential points in each of these three matrices at which transistors, contacts, or first metal conductor segments may be formed. FIG. 11a is a representation of TRANARRAY during the beginning stages of the layout of a pair of simple logic terms. Each dot 503 in FIG. 11a represents a possible location of a transistor source/drain area. FIG. 11a shows how dots 503 would be related to each other in an actual physical layout. For one specific process technology, the horizontal spacing between the point locations in TRANARRAY as projected onto a geometrical plan layout would be 5.25 microns. The vertical distance between dots 503 is on the same order of magnitude.

Turning back to FIG. 9, a term variable M is initialized to one at step 504. Preferably, the first term M is the leftmost term that has been mapped into the symbolic array. A symbolic array for more complicated example is shown in FIG. 4a. The term can be either an AND term or an OR term. This first term M can incorporate all of the Boolean logic of a particular logic equation, or can alternatively be only one of multiple terms of a logic equation.

At step 506 in FIG. 9, this first term M is mapped into TRANARRAY, CTORARRAY and MET1ARRAY. As embodied in the "RESCUE" computer program, term M is shown at this stage as the "T"s in column 0 of TRANARRAY (FIG. 10a), the "C"s in column 1 of CTORARRAY (FIG. 10b) and the "F"s in column 1 of MET1ARRAY (FIG. 10c). The column indices of term M as represented in TRANARRAY, MET1ARRAY and CTORARRAY do not match the column indices in the symbolic array for reasons that will be explained presently.

FIG. 10a shows the effect of mapping term M into TRANARRAY. The symbolic array for this (not shown) noted the requirement for transistors at a plurality of gate conductor row indices 0, 1, 2, 3, 5 and 6 for this first term M. Therefore, the program mapped transistor source/drain areas into TRANARRAY at corresponding transistor row indices 0, 1, 2, 3, 5 and 6, all at column index O. The transistor row indices shown in FIG. 11a are preferably 50% offset from their respective gate conductor row indices for reasons that will be more particularly explained in connection with FIG. 11c.

In FIG. 11a, the filled transistor point locations are shown circled at 508. Once the layout has been finalized, a transistor source/drain area boundary will be drawn as referenced off of a respective one of the filled transistor point locations 508.

In FIG. 11a, a first transistor source/drain area is shown shaded diagonally bottom left to top right at 510. In the illustrated embodiment, the transistor source/drain area 510 corresponds to a transistor point location (0,0). Source/Drain area covers an area defined by point locations (0,0), (0,1), (1,0) and (1,1) with some degree of outward expansion, such as 1.5 microns. This outward expansion increases transistor with and better uses the silicon area for performance of the logic implemented by the array. The left margin of source/drain area 510 is therefore about 1.5 micron to the left of (0,0). The lower margin extends from the left margin below (0,0) and (0,1). The rightmost margin extends from below transistor row index 0 to a boundary 511 that is situated above row index 1. If term M consisted of only one transistor, the only source/drain area that would appear for this term in the final layout would be area 510. Dopant will be implanted into each area 510 to make a source region and a drain region. These will be spaced from each other by a relatively undoped horizontally elongate gate region (not shown) that is self-aligned by a gate conductor (not shown) for that transistor.

Each transistor source/drain area in FIGS. 11a–11b allows a columnar spacer area (not shown) immediately to the right of the implanted regions shown. These spacer areas will not be implanted with an actual source or drain region, but instead insulatively space the transistor source/drain area to its left from a like source/drain area to its right (not shown).

Where transistors are sited at adjacent row indices and at the same column index, the source/drain areas constructed therefrom will overlap in a vertical or columnar direction by approximately 3 microns in one embodiment. In this way, the drain region for one transistor functions as the source region of another vertically adjoining transistor, and space in the columnar direction is saved.

Transistor point location (0,1) corresponds to a transistor source/drain area shown at 512, shown shaded diagonally from top left to bottom right.

The term M illustrated in FIG. 11a is composed of two transistor groups: a first transistor group indicated generally at 514 and a second group indicated generally at 516. Transistor group 514 is an AND group of four transistors that determines the AND function of four signals carried on four adjacent gate conductors (not shown) having gate conductor row indices of 0, 1, 2 and 3. Transistor group 516 is comprised of two transistors and represents the AND of two signals carried on gate conductors that have adjacent gate row indices 5 and 6. A gap 518 between groups 514 and 516 corresponds to the physical location of a possible gate conductor at gate row index 4 that is not used in term M.

Returning to step 506 in FIG. 9, the first term M is also mapped into CTORARRAY and MET1ARRAY, aa shown in FIGS. 10b and 10c. In FIG. 10b, contacts to the transistors of term M are mapped at point locations (1,0), (1,4), (1,5) and (1,7). To connect the transistors to the rest of the structure, first metal conducting segments are mapped into the MET1ARRAY (FIG. 10c) at point locations (1,0), (1,5), (1,8), (1,9) and (1,10).

Returning again to FIG. 9, the procedure considers a next term M+1, which is the logic term that will be disposed in the final array immediately rightward of term M. Step 520 tests whether term M+1 is an AND term. If term M+1 is an AND term, the procedure goes to a decision step 522. If term M+1 is instead an OR term, the procedure branches to a step 524. In step 524, all transistor groups of term M+1 are mapped into TRANARRAY two column indices to the right of the transistor groups of term M, such that there would be no overlap of the transistor source/drain areas of these groups.

At step 522, the procedure compares the lowest-situated transistor group $A_M$ of term M, to the lowest group $A_{M+1}$ in term M+1. The row indices of all of the transistors had been assigned upon optimization of the symbolic array at step 500. These transistor row indices are compared at step 522 to determine whether transistor group $A_M$ is equivalent to transistor group $A_{M+1}$. If each transistor in group $A_M$ has a corresponding transistor in group $A_{M+1}$, the procedure goes to a step 526.

Step 526 asks whether term M+1 is in the same logic equation as term M. If the answer to this is yes, then group $A_{M+1}$ is mapped only one column index to the right of group $A_M$ at step 528, such that the source/drain areas of the transistors in group $A_{M+1}$ are horizontally merged with respective source/drain areas of the transistors in group $A_M$.

The geometric result of step 528 is shown in part in FIG. 11b. The second group $A_{M+1}$ has been mapped at column index 1, and occupies transistor point locations (1,0), (1,1), (1,2) and (1,3). Like the transistor point locations 508 of group $A_M$, the point locations 530 of group $A_{M+1}$ are four in number and have the same row indices as the corresponding point locations 508.

The mapping of transistor group $A_{M+1}$ only one column index to the right of transistor group $A_M$ causes the mapped geometric source/drain areas to be horizontally merged. The area 510 for the first transistor (0,0) in $A_M$ is shown diagonally shaded, lower left to upper right; an area 532 mapped for transistor (1,0) of transistor group $A_{M+1}$ is shown shaded diagonally upper left to lower right.

As shown, the spacing area 512 of source/drain area 510 is completely overlapped by the source/drain area 532. Source/drain area 532 has a spacing area (not shown) that horizontally separates it from transistors to its right. The horizontally merged source/drain area will extend from a left margin 536 to a right margin 538. The horizontal merger of transistors obtained in this manner saves space and allows the design of a more compact logic array.

Turning back to FIG. 9, after group $A_{M+1}$ is mapped one column index to the right of group $A_M$ in TRANARRAY, the program next asks at step 540 whether further transistor groups in term M+1 exist to be considered. If no further groups in the currently considered term exist, the procedure branches to a step 542, at which the entire term M+1 is mapped into CTORARRAY and MET1ARRAY. The term to be considered is advanced to the next term at step 544, and the process repeats for further terms to be implemented into the logic array.

If there exists another group to be considered at step 540, the procedure branches to a step 546, which designates the next group above in sequence in the term as the considered group $A_{m+1}$. The procedure then branches back to group comparison step 522.

In a preferred embodiment, the transistor groups are considered from the lowest to the highest in terms of row index order. However, the groups may also be considered in top-to-bottom fashion.

If at step 526 it is determined that term M+1 is not the same as term M, then the procedure branches to a decision step 548 to test whether the previous equation has only one term. If the answer to this question is yes, the procedure branches to step 528 and the second group $A_{M+1}$ is mapped one column index to the right of first group $A_M$. If the previous equation does not have just one term, then the procedure branches to a decision point 550, where the merged equations are tested for a sneak path. If a conductive sneak path would exist if the two considered groups were adjoined, then the sneak path is avoided by branching to step 524, wherein all remaining groups of term M+1 are mapped in such a way that they do not touch any groups in term M. If no sneak path is possible, the procedure branches to 528, which maps the currently considered group only one column index to the right of its corresponding group, thereby allowing a horizontal merging of source/drain areas and the savings of space.

Using the procedure diagrammed in FIG. 9, the remaining logic terms are mapped into point locations in TRANARRAY, CTORARRAY and MET1ARRAY.

Referring to FIG. 11b, a second group of a second term M+1 has been mapped into TRANARRAY at 541. This second group 540 of term M+1 has two transistors as does the corresponding group 516 of term M, but the transistors have different row indices. Therefore, the two transistors of group 541 are mapped two column indices over at column index two, the transistor point locations being located at (2,7) and (2,8). A spacing area (not shown) of transistor group 516 assures that the actual source/drain areas of group 516 and those of group 540 are appropriately isolated from each other.

Note that the first group of term M+1, indicated generally at 544, has a different column index from the second group 541 of the same term. This is permissible because the horizontal location of the source/drain areas of group 544 overlap with the horizontal location of the source/drain areas of group 541, and therefore, a single vertical first metal conductor can connect them.

This is particularly shown by FIG. 11c, showing the completed layout as developed from the TRANARRAY, CTORARRAY and MET1ARRAY matrices shown in FIGS. 10a–10c. TRANARRAY point locations 503, 508 and 530 have been overlaid onto FIG. 11c to show the correspondence between them and the geometric array structures. A merged eight-transistor group is shown generally at 550. Group 550 arises from the transistors formed around point locations (0,0)–(0,3) and (1,0)–(1,3). Note that the row index of each gate conductor 552 is offset upwardly from the row index of each corresponding transistor point location by about one-half. Since, as based on a point location 508, the transistor corresponding thereto is drawn in an area that extends for the better part upward and to the right of the point location, the corresponding gate conductor 552 will pass over the middle of the plotted transistor.

A transistor group 554 embodies the second transistor group of term M and corresponds to source/drain area 516 in FIG. 11b. Likewise, a transistor group 556 embodies a second group of transistors in term M+1 and corresponds to the source/drain area indicated at 541 in FIG. 11b.

FIG. 11c also shows a plurality of contacts 558–572. Each of contacts 558–572 corresponds to a filled contact point location "C" in the CTORARRAY (FIG. 10b). The row index for each contact 558–572 is upwardly displaced from the corresponding gate conductor index by preferably 50% of the distance between the gate conductor above it and the gate conductor below it, so as to match the row index of a potential transistor source/drain area. The column index of each contact 558–572 will match a transistor column index and a first metal conductor column index.

As is shown for example at transistor point location (0,5), the source/drain area generated therefrom 554 extends to the right past an adjacent point location (1,5), upward past a respective gate conductor 578, and further past a next potential contact point location mapped at (1,6). Therefore, the contact 562 is made in a corner of the transistor source/drain area mapped from point location (0,5). A contact made to an upper right hand corner of a source/drain area is shown at 564, while a contact to a lower left hand corner of a source/drain area is shown at 570.

FIG. 11c also shows the disposition of a plurality of first metal conductor segments 584–602. Each first metal conductor segment 584–602 corresponds to a filled MET1ARRAY point location "F" shown in FIG. 10c. Segment 588 in the middle of the implemented array shown in FIG. 11c spans a gate conductor 604 to two separate two source/drain areas 554 and 550, and makes connection between two contacts 562 and 560. Segment 588 has a row index that matches the row index of corresponding gate conductor 604.

Conductor segment 588 shows the geometric limits of an isolated conductor segment that is built from one MET1ARRAY field point location. A single segment will span a respective gate conductor, extend upward past the next row index of a CTORARRAY point location, and will extend downward past the next lower CTORARRAY point location. In this manner, conductor segment 588 extends upwardly and downwardly a sufficient distance to make contact to contacts 562 and 560.

Where several first metal conductor segments are required to connect a pair of contacts, such as contacts 568 and 570, the mapped conductor segments will overlap in a manner similar to the vertical overlap of transistor source/drain areas in a single transistor group. Thus, conductor segment 590 extends to an upper boundary 606; a next conductor segment 592 extends from a lower boundary 606 to an upper boundary 610; and a third conductor segment 594 extends from a lower boundary 610 to an upper boundary 614.

The physical, geometric dimensions of first conductor segments 584–602 are chosen such that one columnar edge of them will be aligned with the edge of a source/drain area to which they connect. For example, a vertical boundary 616 of conductor segment 590 is colinear with the source/drain area boundary 618 of merged transistor group 550. The alignment of the vertical conductor boundaries and the vertical source/drain area boundaries allows for a more compact design and proper spacing of first metal conductors from each other.

FIG. 11c also illustrates how term M+1 can be constructed around the axis of a single column index of first metal conductors. The algorithm preferably chooses a location of the first metal conductors such that the source/drain areas of the connected transistors will be disposed underneath and to the left of the conductor. This is the case for the transistors connected by first metal conductor segments 584, 588, 596–600 and 586. However, when space is not available to the left, a transistor may be formed underneath and to the right of a first metal conductor, as shown by source/drain diffusion area 556 in relation to conductor segments 590–594 and segment 602. Where a further shift to the right is necessary, such as possibly for transistor groups above group 556 in term M+1, the column index to be used for the contacts and the first conductor segments will be further displaced rightward.

Because of horizontal merging of source/drain areas, certain first metal conductors, such as segments 584 and 588, appear to be disposed in the middle of one or more source/drain areas to which they connect. However, one columnar boundary of these conductors, such as the right boundary of segments 584 and 588, will nevertheless be aligned with a source/drain columnar boundary of a single transistor, even if the effect of the boundary has been erased by horizontal merger. This assures regularized placement of contacts and conductors with respect to merged source/drain areas.

Once the physical random logic array has been determined, respective tiles for each equation and equation branch are mapped into the overhead and underfoot tile sections in a left-to-right order. This left-to-right order is compatible with the order of the Boolean portions of the logic equations in the logic array.

Figure 12A:
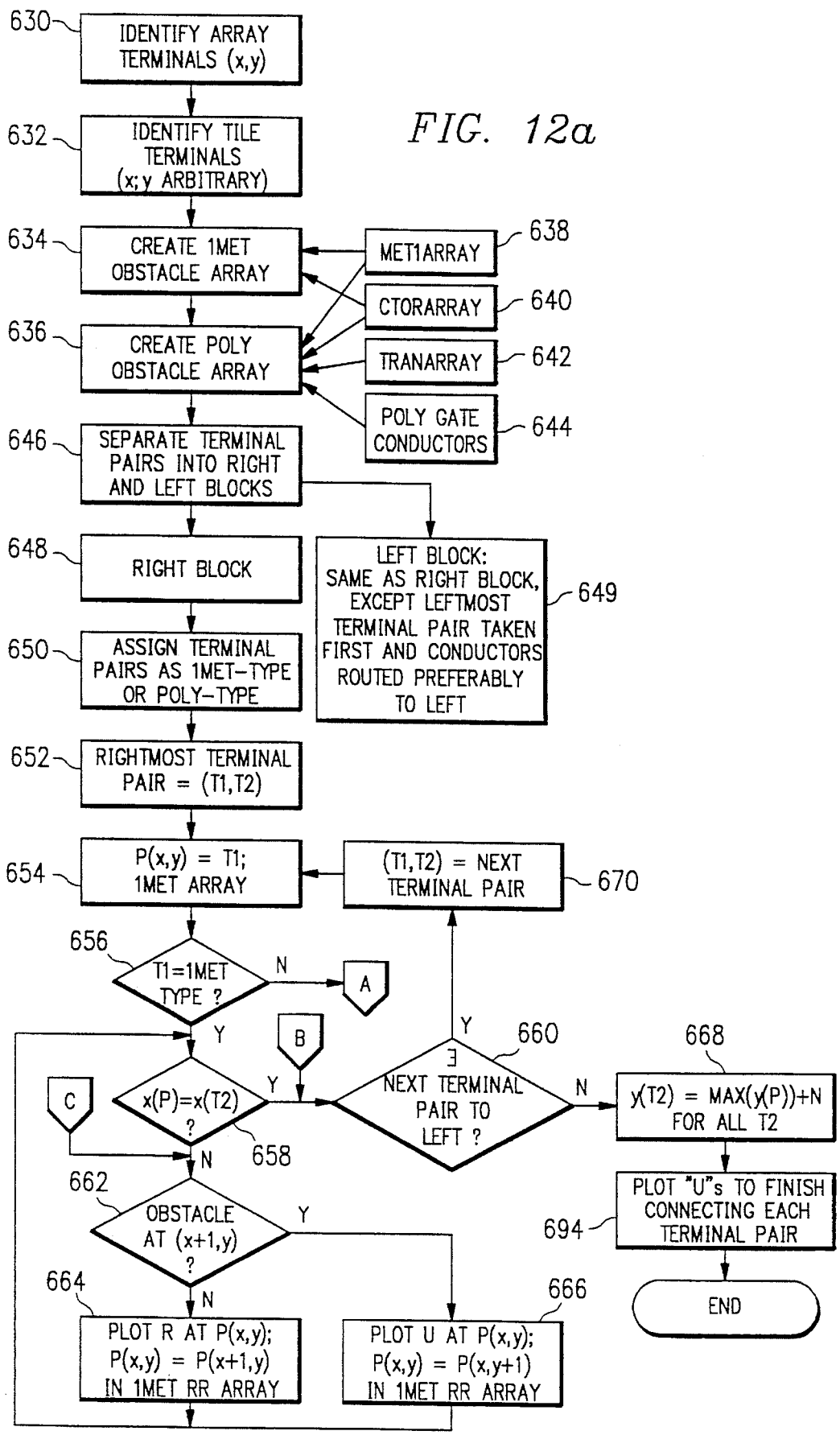
FIGS. 12a and 12b together comprise a flowchart showing successive steps of a river routing algorithm according to the invention.

Next, the river routing is implemented between the logic array and the tile sections. A preferred river routing method according to the invention is diagrammed by the flowchart shown in FIGS. 12a and 12b. Referring first to FIG. 12a, the terminals of the river routing conductors are identified at step 630. Inside the logic array, a river routing terminal is designated for each logic equation output, each signal input from the top and each signal feedback.

The array terminals identified at step 630 have an x-coordinate and a y-coordinate. The y-coordinate is fixed as either the gate conductor row index, if the signal being routed is a signal input or feedback, or a contact row index to a last source/drain area of a transistor group, if the signal being routed is an equation output.

Next, a set of tile terminals, each corresponding to an array terminal, is identified at step 632 in FIG. 12a. As will be more particularly described in conjunction with FIGS. 5 and 6, the tile section of the layout is comprised of a plurality of tiles that each comprise custom-designed non-Boolean portions of the respective logic circuits. At least one terminal is identified for each of these tiles.

Like the array terminals, the tile terminals identified at step 632 have x- and y-coordinates. The x-coordinates are fixed by the location of the respective tiles within the tile section. At the beginning of the river routing algorithm, the y-coordinate for each of these tile terminals is assigned a large, arbitrary value that will be decreased after the river routing space requirements become known.

At step 634, a first metal river routing obstacle array is created, and at step 636, a corresponding polysilicon river routing obstacle array is created. These obstacle arrays are created for the routing of respective levels of river routing conductors. Step 636 creates an obstacle array for conductors running at a first level, in the illustrated embodiment fabricated of polysilicon. Step 634 creates an obstacle array for a second level of river routing conductors, in this case conductors fabricated in a first metallization step and known as "first metal".

Obstacle arrays 634 and 636 are two-dimensional matrices of point locations that are generated from different element arrays such as those illustrated in FIGS. 10a through 10c. At step 634, points in the obstacle array will be filled with structures that a first metal conductor segment must avoid. Thus, contributions to the first metal obstacle array will be made from the MET1ARRAY, as is shown at step 638. The MET1ARRAY, as has been previously explained, stores point locations for the first metal conductor segments that interconnect the term transistors in the array. The first metal river routing conductors must also avoid all contacts between the first metal conductors and either the gate conductors or the substrate. Therefore, all elements of CTORARRAY at 640 become elements in the first metal obstacle array.

Referring to FIG. 13b, a first metal obstacle array is shown for a selected portion of the river routing section shown in FIG. 6. The illustrated section extends from row indices (y-coordinates) 3 through 19 and column indices (x-coordinates) 17 through 27. A plurality of array terminals are represented by "T"s at various points within the array below row index 18. The x-coordinate of each terminal T is different from any remaining array terminal x-coordinate.

At row index 19, five terminals are plotted at column indices 23 through 27. These are the tile or second terminals each corresponding to a respective array or first terminal. Although the tile terminals are shown plotted at row index or y-coordinate 19, their y-coordinates would actually be arbitrarily set at a much larger value at this stage.

The first metal river routing array also shows a plurality of array locations each filled with a "C". The array automatically classifies as an obstacle any point location immediately below a terminal T. The remaining obstacles come from contacts and first metal conductors, and are shown by "X"s. The array also classifies as obstacles all of those point locations below an obstacle resulting from a contact or a first metal conductor. This is so the river-routed conductor will not be routed into a "dead end", as will be made apparent by the example given in conjunction with FIGS. 13–16.

Returning to FIG. 12a, the polysilicon obstacle array created at step 636 includes all array structures that a river-routed polysilicon conductor must avoid. These include the contacts in CTORARRAY at 640, all transistor source/drain areas as stored in TRANARRAY at 642, all polysilicon gate conductors at 644, contacts to gate conductors as can be stored in 1METARRAY at 638, and all point locations below these obstacles.

In FIG. 13a, the obstacle array for the first or polysilicon level is shown. The first and second river routing conductor terminals are again shown by "T"s. As in the first metal river routing array of FIG. 13b, all point locations immediately beneath the array terminals are considered obstacles, and are marked with "C"s. Source/drain areas are shown by "Q"s, gate conductor locations are shown by "G"s, and contacts and other obstacles are shown by "X"s.

Because of offset considerations, no poly conductor segment should be represented by a point location immediately adjacent a terminal "T". Thus, "X"s are inserted at (17,10), (18,9), (26,10), (24,10) and (25,10). This also occurs in certain circumstances in the 1MET array, as for example where a horizontal first metal conductor used to implement a static gate term must be avoided. This is shown at FIG. 13b at (24,10) and (26,10).

Returning to FIG. 12a, the terminal pairs identified at steps 630 and 632 are separated into a right block and a left block at step 646. Each river-routed conductor in the right block will be preferentially routed toward the right side of the river routing section, and each conductor in the left block will preferentially be routed toward the left side of the section. The right block and left block are routed independently, as is shown by steps 648 and 649. This is possible because the right and left blocks do not present any routing conflicts in relation to each other. In the right block, the first conductor to be routed is routed between the rightmost terminal pair thereof. The remaining river routing procedure is illustrated for the right block only, it being understood that the procedure for the left block is identical except for the fact that the leftmost terminal pair of the left block is taken first instead of the rightmost terminal pair, and that the conductors of the left block are routed preferably to the left instead of to the right.

At step 650, the terminal pairs are further designated as being of a first level, or polysilicon, type or a second level (first metal). This assignment can be made based on one or more of several considerations. The operator of the algorithm may manually select which river routing conductors will be at the first, or polysilicon, level or the second, or first metal, level. Alternatively, the terminal pair type assignment can be made on the basis of the connected tile conductor. Each second terminal at the bottom of the respective tile is connected to a conductor within that tile, which can be either polysilicon or first metal in the illustrated embodiment. Finally, the assignment as to type can be made according to the relative congestion of the level on which the conductor is to be routed. If this last method of type selection is used, there will be a good balance between the routing density of the first and second levels.

Continuing with the routing procedure for the right block at step 652, the rightmost terminal pair is first selected for routing. This terminal pair is herein designated as (T1, T2). At step 654, a routing point P(x,y) is defined as the current end of the conductor being routed. Routing point P(x,y) starts at the x- and y-coordinates of terminal T1 inside the logic array. For both kinds of terminal pair level types, the routing in the illustrated embodiment begins in the first metal obstacle array rather than the polysilicon obstacle array.

At decision point 656, the level type of terminal T1 is ascertained. If the current terminal T1 is of the first metal type, the procedure advances to decision point 658. If it is not of the first metal type, terminal T1 will of the polysilicon type and the procedure branches to connector A, which connects to a poly obstacle array branch of the algorithm shown in FIG. 12b.

Assuming that the terminal T1 is of the first metal type, decision point 658 is reached, which asks whether the x-coordinate x(P) of the routing point is presently equal to the x-coordinate of the tile terminal T2. If x(P)=x(T2), the routing point will be directly beneath the second terminal, and further routing of this conductor need only go in a y direction. The first phase of the routing for this particular conductor will then be halted, and the algorithm will branch to a decision point 660.

At the beginning in most instances, however, these x-coordinates will not be equal to each other, and therefore the algorithm will branch to a decision point 662. At 662, the obstacle array is inspected at point (x+1, y) to determine if an obstacle exists at this location. This point is immediately to the right of the current position of the routing point. An obstacle can be either a structure that was used initially to formulate the first metal obstacle array, or a previously routed first metal conductor. If an obstacle does not exist, the procedure branches to step 664, which plots an "R" at the current routing point in the 1MET obstacle array and advances the routing point rightward one column index to point (x+1, y). The procedure then branches back to decision point 658, which will again test whether the routing point is now directly underneath the second terminal.

If an obstacle is found to exist to the right of the current position of the routing point, the procedure branches to a step 666, which will plot a "U" in the 1MET array at the current routing point and will advance the routing point upward by one row index to a point (x,y+1). The procedure then loops back to decision point 658.

At decision 660, the algorithm asks whether there is a terminal pair remaining that needs to be routed. If no such terminal pair exists, the second phase of the river routing is initiated at step 668. If another terminal pair does exist to be routed, the procedure branches to a step 670, which assigns the coordinates of the next-taken terminal pair to variables T1 and T2. From step 670, the procedure branches back to step 654, and the routing of the next. river routing conductor takes place.

Figure 12B:
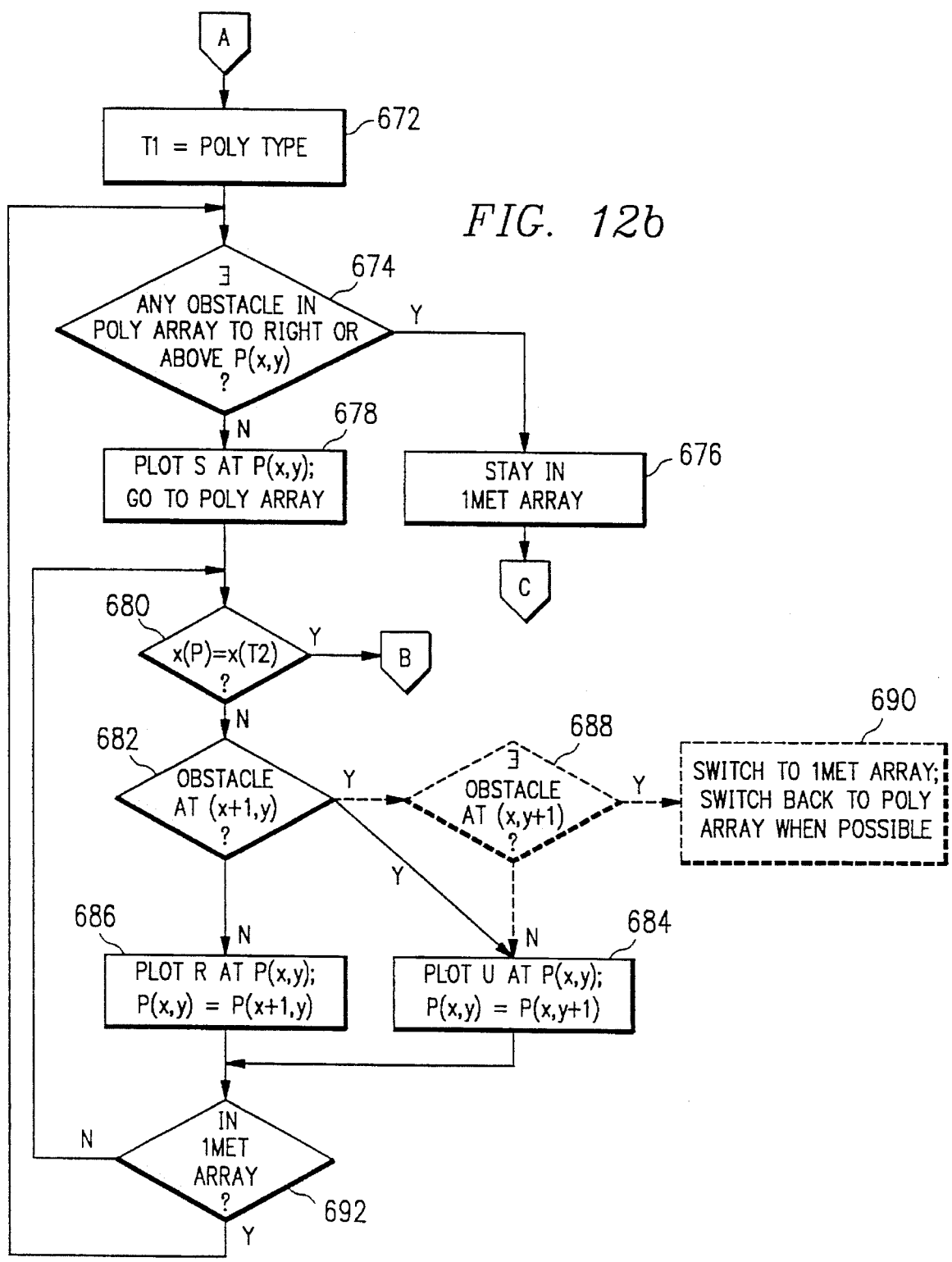

FIG. 12b diagrams a flowchart for that portion of the algorithm that routes polysilicon- or first level-type terminal pairs. From step 656 in FIG. 12a, the terminal pair has been determined to be of polysilicon type as is shown at step 672 in FIG. 12b. This branch of the procedure next advances to decision point 674, which tests the polysilicon obstacle array to determine whether any polysilicon obstacles exist immediately above or to the right of the current location of routing point P(x,y). If further polysilicon array obstacles are found, the procedure branches to a step 676, which dictates that the river-routed conductor remain at the first metal level and that the routing activity remain in the first metal array. From step 676, the algorithm proceeds back to decision point 662 in FIG. 12a.

If there are no remaining array polysilicon obstacles, the procedure instead branches to a step 678. At step 678, an "S" is plotted at the current point location of P(x,y) in the first metal obstacle array, and the routing procedure is switched over to the polysilicon obstacle array. A "U" or an "R" is marked at the P(x,y) of the poly obstacle array depending on whether the next available poly obstacle array point is P(x,y+1) or P(x+1,y).

From step 678, the procedure advances to a decision point 680, wherein the x-coordinate of the routing point is again tested for equality to the x-coordinate of the second or tile terminal. If the x-coordinates are equal, thus indicating that the routing point is immediately beneath the second terminal, the algorithm looks for the next terminal pair to route and branches back to decision point 660 in FIG. 12a. If the routing point is not yet underneath the second terminal, the procedure advances to a decision point 682, which tests for an obstacle rightward of the current routing point in a manner similar as that described for step 662 of FIG. 12a. If an obstacle exists, which will in the illustrated embodiment be a previously routed polysilicon conductor, a "U" is plotted at the current routing point at step 684 and the routing point is advanced upward by one y-coordinate. If no obstacle exists immediately to the right of the current routing point, an "R" is plotted at the current routing point and the routing point is advanced rightward by one x-coordinate at step 686.

In the illustrated embodiment, the switch to the polysilicon array is made only after all polysilicon array obstacles have been passed. This however need not be the case. In instances where it is desirable to start the routing in polysilicon, the procedure would instead branch to a step 688 from step 682, shown in phantom. At step 688, the algorithm asks whether an obstacle exists immediately above the routing point, it having been previously ascertained that an obstacle also exists immediately to the right of the current routing point at decision point 682. An affirmative to step 688 indicates that both upward and rightward movement of the routing point is blocked at the poly level. In this instance, the routing conductor is switched back to the first metal level at step 690. First metal routing occurs in the manner as above described for FIG. 12a until routing in the polysilicon layer is not blocked in both directions. Then the routed conductor is switched back to the polysilicon layer through a contact, and routing in the polysilicon layer proceeds thereafter.

From either steps 684 or 686 the procedure advances to a decision point 692, which asks whether the routing is presently being accomplished in the first metal array. If the answer is yes, the procedure branches back to step 674, and again tests to see whether any remaining obstacles in the polysilicon array exist. If the answer is no, the routing continues in the polysilicon array until the first phase of the routing is completed.

Returning back to FIG. 12a, the second phase of the river routing is initiated at step 688. At this point all of the conductors have been routed to points immediately below their respective terminals, and only vertical segments of the routing conductors remain to be routed. At step 668, the maximum y- coordinate for each current river routing conductor end is determined. The current endpoints for each of the river routing conductors define the last turn that the river routing conductor has to make before proceeding directly upward to the second terminal. The procedure uses this maximum y-coordinate to determine the y-coordinate for all tile terminals. This fixes the y-coordinate for all tile terminals, which will in general be much less than the arbitrarily large y-coordinate initially assigned to all the T2 terminals at step 632. If desirable, the y-coordinate of each second terminal may be spaced an arbitrary number of row indices n above the highest river routing turn.

The procedure next advances to a step 694, which plots "U's" for each river routing conductor in the appropriate first or second level array to finish the connection between each terminal pair (T1, T2). This finishes the river routing sequence.

In FIGS. 13a, 13b, 14a, 14b, 15a, 15b and 16, an example has been provided to show the river routing of five terminal pairs in a small section of FIG. 6 (to be described below). In FIGS. 13a and 13b, the beginning steps of the routing for a first terminal pair (25,9), (27,19) are shown. The first metal and polysilicon obstacle arrays have been generated as previously described.

With particular reference to FIG. 13b, the routing starts in first metal. Terminal (25,9) is connected to a static CMOS gate that uses a horizontal conductor to correct a CMOS pair. The program module generating the first metal obstacle array takes special recognition of this fact by placing "X"s around terminal (25,9). However, the "X" above the terminal is made transparent to a first metal river-routed conducter that is routed from the terminal.

The routing will proceed to the right wherever possible. A first metal obstacle "X" exists at position (26,9). Therefore, the routing point is moved upward to position (25,10), replacing the transparent "X" with a "U". Since the routing is still adjacent to the terminal, the routing is again advanced upward-to position (25,11).

At this point, it is determined that no polysilicon array obstacles (C, G, Q, T, X) exist either upward or to the right of position (25,11). Therefore, an "S" is plotted at this position in the 1MET array, and the routing switches over to the polysilicon river routing array in FIG. 13a. Since no polysilicon obstacle exists at the position immediately to the right, the routing is plotted in this direction, and again, over to position (27,11). At this point, the river routing point is immediately below the corresponding second terminal T2 at (27,19). The program then proceeds to route the next terminal pair, although the remaining river routing as shown in FIG. 13a for the first terminal pair for purposes of clarity.

In FIG. 14b, the beginning steps for the routing of the second terminal are shown. Like the first terminal pair, the second terminal pair has also been designated as polysilicon-type. The second terminal is however buried well within the array at position (21,4), and thus is routed for a large distance at the first metal level. As shown by the dotted line enclosure, a series of "U's" and "R's" is plotted until point (23,10) is reached. At this point, no further polysilicon obstacles are immediately above or to the right of the current routing point, and therefore the routing is switched over to the polysilicon river routing array shown in FIG. 14a.

From here, the river routing in general is routed to the right until another previously routed conductor is encountered at position (25,11). Therefore, the routing stops its rightward motion at point (24,11) and advances upward to point (24,12). It is then allowed to continue rightward until point (26,12). At this last point, it is below the second terminal that corresponds to the first terminal of this pair, and the routing considers the next terminal pair. As in FIG. 13a, the vertical phase of the routing is shown for purposes of clarity.

Turning next to FIG. 15b, the routing for a third terminal pair is shown. This terminal pair had been previously designated as first metal-type. Therefore, the routing will occur entirely within the first metal level, with no switching to the polysilicon level. The river routing for the third terminal pair proceeds within the dotted line enclosure shown in FIG. 15b, avoiding only the first metal obstacles in the first metal obstacle array. The obstacles to polysilicon routing shown in FIG. 15a are ignored. Since the third terminal pair has been routed completely at the first metal level, no additional points are plotted in the polysilicon river routing array shown in FIG. 15a.

Upon a superposition of FIG. 15b onto FIG. 5a, it will be noticed that the first metal points in several instances overlap polysilicon routing points. This is one of the major advantages of a two-level river routing system, as an increased compaction is allowed.

Figure 16:
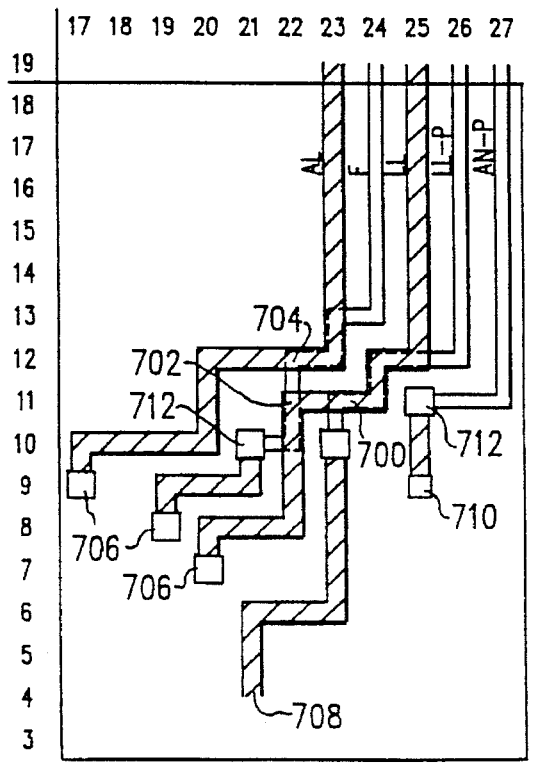
FIG. 16 is a detail of FIG. 6 showing selected river-routed conductors as generated according to the method illustrated in FIGS. 12a and b, 13a and b, 14a and b and 15a and b.

FIG. 16 shows the completed river routing conductive leads for five terminal pairs. Overlaps between the polysilicon-level and the first metal-level routing conductors occur at points 700, 702 and 704. The polysilicon conductors are designed to be thinner than the first metal conductors, and are shown in phantom under the first metal conductors. The first metal conductors are insulatively disposed over the polysilicon conductors at a second level, and are shown shaded. In most but not all instances, the river routing will start from a contact, as is shown at points 706. Another type of first terminal is shown at point 708, which is a direct connection to a first metal conductor used to interconnect the transistors of a respective term. Another kind of array terminal is shown at point 710, which is a contact to a source or drain diffusion area. Contacts 706 are each made to polysilicon gate conductors.

For correspondence to FIG. 6, the polysilicon and first metal river-routed conductors have been labeled with the signals that they carry. River-routed conductive leads AN-P, LL-P and F each include a switching contact 712. Before this point, the routing for these signals is done in first metal. River-routed conductive leads LL and AL are routed entirely at the first metal level. This completes the fabrication process of the entire control logic circuit.

FIG. 5 illustrates a plan view in outline of a complexed control logic circuit that is indicated generally at 210. This control logic array corresponds to the input data set illustrated by FIG. 3, and the symbolic array illustrated by FIGS. 4a and 4b. The control logic circuitry 210 is comprised of a logic array 212, an overhead tile section 214, and an underfoot tile section 216. A river routing section 218 is shown that connects the logic array section 212 with the overhead tile section 214. A similar river routing section 220 connects selected points in the logic array 212 to the underfoot tile section 216. River routing sections 218 and 220 each comprise a plurality of polysilicon and/or first metal conductors 222. that the conductors 222 do not make connection merely to the edges of logic array 212, but instead to selected points within logic array 212.

Logic array 212 has sited within it a plurality of transistors 224. Over each transistor 224 travels a polysilicon gate conductor (not shown) that is disposed in parallel horizontally with like gate conductors. These polysilicon gate conductors will be more completely described in conjunction with FIG. 6.

Overhead tile section 214 incorporates a plurality of elongate tiles 226. Each tile 226 comprises the non-Boolean circuitry necessary to effect a respective logic equation whose Boolean component has been mapped into logic array 212. One kind of tile, as is illustrated at 228, incorporates a plurality of custom-designed transistors and interconnections therebetween. The interior details of tile 228 and like tiles are not shown; a tile subsection 230 showing typical interior structure is more particularly illustrated by FIG. 8. Other tiles may consist only of a single conductor, as are indicated at 232. Conceptually, a tile is any structure that takes up area within a tile section such as section 214 or 216.

In the case of tile 232, the actual tile is comprised of a conductor and the space on either side of it to space it from like conductors and other circuit structures. A single-conductor tile 232 is usually associated with a TRUE FROM-TOP input signal as shown in FIG. 4a. For purposes of clarity, not all tiles in tile sections 214 and 216 have been shown.

It has been found that certain circuit structure inside the tiles can be duplicated in pairs at a savings in horizontal space, and thus, for example, tile 228 may be paired with a tile 234 on its lower half, and a tile 236 near its upper end. Tile 228 is itself composed of four circuit sections. A sense amplifier or dynamic precharge clock 230 is disposed near the bottom of tile section 214 adjacent logic matrix 212; a first register portion 238 is disposed next above portion 230; a second register portion 240 is placed next above first register portion 238; and an output buffer section 242 is placed next above section register 240. While these various circuit components are in this instance grouped as a single tile 228, it is also possible to dispose of them in spaced relationship and interconnect them with one or more conductors. In this manner, it is possible to achieve a better efficiency of area use within tile section 214.

Tile section 214 incorporates both serial and parallel scan chains. A parallel scan chain is shown at 244. This is a conductor that connects selected circuit structure inside tiles 226 for the purpose of testing their functions.

A plurality of conductors 246 are also shown that connect selected tile portions together in series. Conductors 246 and the circuit components that they interconnect form a serial scan chain that is designed to test the operation of selected elements of the control logic circuit, such as registers or memory elements, in series. Both the serial scan chain 246 and the parallel scan chain 244 are incorporated into the overhead tile design automatically by the computer program of the preferred embodiment. Circuit structure for the parallel scan equations described for FIGS. 2 and 3 is also incorporated into overhead tile section 214 rather than in the logic array 212.

In many instances, the overall horizontal dimension of a single tile section 214 will be much greater than the horizontal dimension of the corresponding logic array section 212. In this case, in order to conserve horizontal distance, many functions are put into a bottom tile section 216. Such functions typically include power and ground sources, clock sources and certain inverters, buffers and simple registers for signals to be fed back into logic array 212. It is also possible to put any of the remaining non-Boolean functions into bottom tile section 216 rather than top tile section 214.

Bottom section 216, like top section 214, comprises a plurality of bottom tiles 250 that are connected to the Boolean portions of the respective logic equations through a river routing section 220. Once again, river routing section 220 does not stop at the boundary of logic array 212, but connects to points at various vertical locations within logic array 212.

In essence, the river routing sections 220 and 218 are not confined to the areas outside of logic array 212, but conceptually extend throughout logic array 212 for the purpose of routing conductors. This gives an additional advantage of flexibility for placing the columnar conductors in the most efficient manner.

Bottom tile section 216 further comprises a serial scan chain indicated at 252. Like serial scan chain 246 in upper tile section 214, serial scan chain 252 is designed to test the serial operation of the register function of several circuit components within bottom tiles 250.

Turning to FIG. 6, a detailed schematic magnified plan view of logic array 212 and river routing sections 218 and 220 is shown. Selected details of FIG. 6 are shown in FIGS. 6a–6e, and the structure of these details has been omitted from FIG. 6 for the purpose of clarity. The logic array 212 and the overhead and underfoot tile sections (not shown in FIG. 6) are implemented at a face of a semiconductor substrate or layer 253 such as silicon. The semiconductor substrate 253 is selected to be of a predetermined conductivity type, such as p-type. Within substrate 253, one or more tank regions 251 are formed such that transistors of both conductivity types can be implemented into array 212. In the illustrated embodiment, an n-tank, n-well or n-tub 251 is formed in p-type substrate 253 so that selected p-channel transistors 254–258 may be formed therein. A plurality of other transistors 254–286, 288, 290 and 292 are formed in the remaining p-type area of the substrate 253, and are n-channel.

Each transistor 254–286, 288, 290 and 292 is rectangular in shape and, as isolated from the other transistors, has diffused source and drain regions of a predetermined size. In an alternative embodiment, a modified computer program is used such that variations in logic array transistor size and other structural details are permitted. In the illustrated embodiment, the transistor size has been chosen to be uniform and larger that absolutely necessary in order to improve the operating characteristics of logic array 212.

Figure 6A:
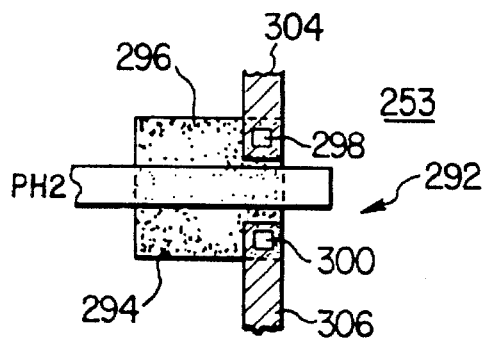
FIGS. 6a–6e are details of FIG. 6 showing various gate transistor configurations.

A detail of a single transistor 292 as formed in logic array 212 is shown in FIG. 6a. The selected transistor is a transistor implemented in the lower right-hand corner of array 212.

A polysilicon gate conductor, in this instance carrying clock signal PH2, is formed across an area including the prospective gate region of transistor 292. Hereinafter, the various conductors will in general be identified by the names of the signals they carry. After gate conductor PH2 is formed, the surrounding area is masked by photoresist and an implantation step is done in order to create a diffused n-type drain region 294 and a source region 296. The polysilicon gate conductor PH2 is spaced from the substrate by a suitable layer of gate oxide (not shown). An overlaying thick layer of oxide is placed on diffused regions 294 and 296 and the surrounding regions. A contact 298 is opened up to drain region 294, and a like contact 300 is opened up to source region 294. First metal conductors 304 and 306 are then deposited, patterned and etched to complete the connections to transistor 292.

In the illustrated embodiment, each poly gate conductor, such as gate conductor PH2, has a predetermined standardized conductor width, as do all first metal conductors such as conductors 304 and 306.

Another advantageous feature of the invention is the way in which contacts 298 and 300 are made to the corners of diffused regions 294 and 296, rather than to these regions' centers. Making contacts to the corners of the transistor in this manner allows space for another contact to another corner, as is shown for transistor 254 (FIG. 6b), or allows another first metal columnar conductor to pass over a non-contacted area of the transistor.

Figure 6C:
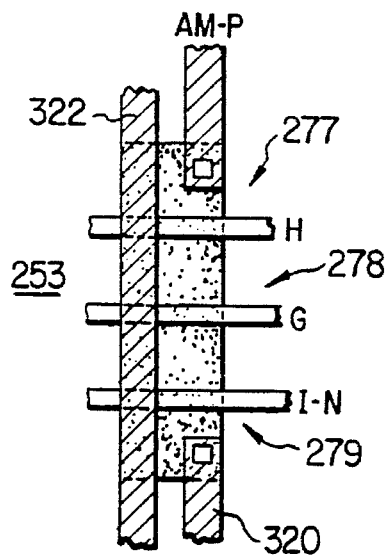
Figure 6B:
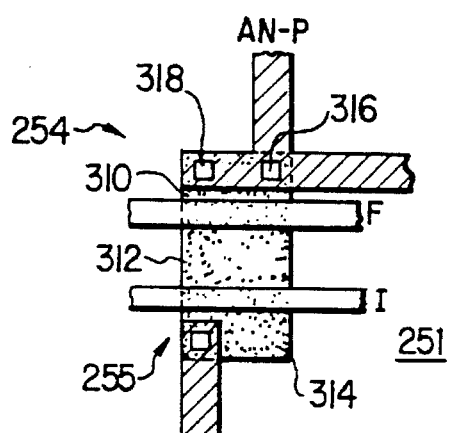

FIG. 6b is a detail of FIG. 6 showing a pair of transistors 254 and 255. FIG. 6b shows how the computer program is able to identify transistors that may be fused in a vertical or columnar direction. A first transistor 254 is comprised of a source region 310 and a diffused region 312 that acts as its drain. Transistor 254 is activated by polysilicon gate conductor F. Transistor 255 is comprised of a drain region 314, and diffused region 312 which in this instance acts as transistor 255's source. Transistor 255 is activated by a signal on polysilicon gate conductor I.

FIG. 6b also shows how contacting the corners of transistor 254 allows for more than one contact to be made. In this instance, a pair of contacts 316 and 318 are made to the source region 310 of transistor 254. Also, note the preferred layout technique of having the edges of first metal conductor AN-P be congruent with the diffused region boundaries of transistor 254 wherever possible. Each transistor such as transistors 254 and 255 normally occupy a space over which two first metal conductors can be run as laterally spaced from each other. In this embodiment, each column index equals a first metal conductor width plus spacing on either side. Two such column indices equals a transistor width plus spacing between it and other transistors. The row spacing of an isolated transistor is large enough to allow for first metal/diffusion contacts. In the case where a drain of a first transistor and a source of a second transistor are at the same circuit node, the two diffusions are merged and the spacing between them eliminated.

In FIG. 6c, a further detail of FIG. 6 is shown, in particular illustrating combined transistors 277, 278 and 279. These are activated respectively by gate conductors H, G and I-N. As in transistors 254 and 255, transistors 277, 278 and 279 share a diffused region between each pair of them, thus allowing the vertical compaction and fusion of the transistors 277–279. First metal conductor AM-P makes contact to the upper right corner of transistor 277, and a first metal conductor 320 makes contact to the lower right corner of transistor 279. The placement of the contacts over to one side in the transistor structure allows the overlay of a first metal conductor 322 on the other side of transistors 277–279. Additional space for routing the first metal conductors is thus obtained.

Figure 6D:
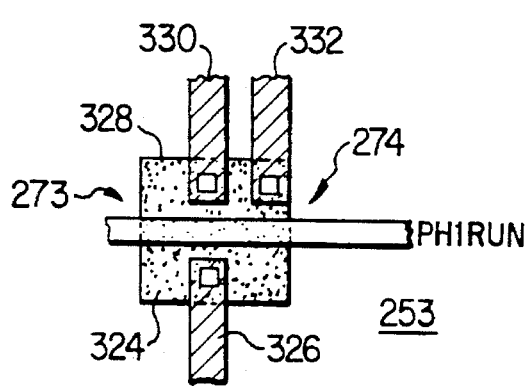

FIG. 6d is a further detail 1 of the random logic array 212 shown in FIG. 6, showing the horizontal merging of two transistors 273–274 that are both activated by clock signal gate conductor PH1RUN. Through its pairwise exchange heuristic algorithm, the program has the capability of sorting out and placing together various logic equations and branches thereof that use the same input signal as one of their operands. When transistors end up placed next to each other, the preferred program inspects whether or not these transistors may be horizontally merged, and still maintain the same logic function. The preferred program tests to see that this merger will not create a sneak path in the logic before finalizing this design modification. Merged transistors 273 and 274 share a combined source region 324 that is connected by a first metal vertical conductor 326 to ground.

Transistors 273 and 274 further share a drain region 328 that has more than ample space for the connection of a pair of first metal conductors 330 and 332. Since transistors 273 and 274 do not need to be horizontally spaced from each other, this space is deleted and the two branches of respective logic equations can be squeezed closer together in a horizontal or row direction. The two branches can be from the same or different equations. Additional space is therefore advantageously provided for the routing of other first metal conductors.

Figure 6E:
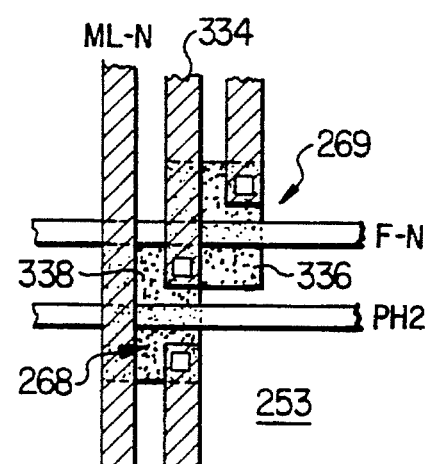

The detail shown in FIG. 6e illustrates the formation of transistors 268 and 269, which are allowed to merge on one corner. The preferred program is able to ascertain a node or common connection to a first metal conductor between adjacent transistors, as transistors 268 and 269 make a common connection to first metal conductor 334. This recognition occurs even though conductor 334 makes connection to the effective source region 336 of transistor 269 and also to the effective drain region 338 of transistor 268. The resultant merger of transistors 268 and 269 occurs both in the horizontal and vertical direction, saving space in both of these directions.

FIG. 6e also illustrates the use of unused space over transistor 268 for the insulative overlay of a first metal conductor ML-N. Further, in a preferred embodiment, each transistor is sited such that its upper and lower limits do not extend further than adjacent poly gate conductor tracks. Thus, the lower limit of transistor 269 is spaced in a regular manner above polysilicon track PH2, and the upper limit of transistor 268 is spaced below polysilicon track F-N.

On the left side of logic array 212 of FIG. 6, a succession of transistors 262, 263, 260, 261 and 259 are all gate transistors for a Boolean portion of a logic equation. This logic branch evaluates output signal Q-P, as shown carried by a respective first metal conductor Q-P that makes connection to transistors 262 and 263. The input signals used by this branch are, from top to bottom, Q-F, U, R, J, and PH2. The Boolean logic expression being evaluated is Q-P= PH2(R+J)(V+(Q-F)), and is the implementation of the Boolean portion of the DEFREGISTER RTL equation shown at 182 in FIG. 3. This leftmost logic branch illustrates that the transistors making up a single Boolean logic portion do not strictly have to be stacked on top of each other, but may be modified according to the needs of the first metal conductor routing and poly track length minimization.

In the illustrated example, all connections to the poly gate conductors are made through river routing conductors from either the top tile section 214, or from the bottom tile section 216. The preferred program allows the routing of the first metal routing conductors to various points within logic array 212 rather than just to the logic array boundary. For example, on the left side, a first metal river routing conductor KL-FN makes connection through a via to a poly gate conductor of the same name approximately in the middle of the array. Thus, for river routing purposes, the river routing module of the program treats the entire array as available space for its river routing needs rather than river routing sections 218 and 220 by themselves. The connections can be made well into the interior of array 212, either from the top section 214 or the bottom section 216. An exemplary connection from bottom section 216 is shown by first metal conductor ML-N which passes over transistor 268 (FIG. 6e) to connect to a gate conductor of the same name through a suitable via.

The program is also capable of determining where horizontal first metal conductor connections should be made in order to implement various Boolean logic operations. For example, transistors 254 and 255 (FIG. 6i b) and transistors 283 and 284 (FIG. 6) are all used to implement a dynamic logic expression that outputs a signal AN-P. In order to implement this dynamic expression, transistors 254 and 255 need to be within n-tank 251, and transistors 282 and 284 need in the regular p-type substrate 253. A horizontal section 340 in the first metal is implemented in order to connect these two branches together.

Note also how one single n-tank 251 is used to implement both one set of transistors 254 and 255 (FIG. 56b) and another set of p-channel transistors 256, 257 and 258 lower in the array. The preferred program is able to recognize the use of p-channel transistors in any Boolean logic branch, and groups them together where possible in a single n-tank. Space in a horizontal or row direction is therefore saved, since each n-tank, as n-tank 251, must be sufficiently spaced from surrounding n-channel transistors.

In order to obtain proper operation of p-channel transistors 254 and 255 (FIG. 6b) and transistors 256, 257 and 258 (FIG. 6), it is necessary to contact the semiconductor substrate inside n-tank 251 to VCC. This accordingly is done through a via 344. The program is able to discern the requirements of such a via and an associated first metal conductor 346.

Several of the advantages of the invention lay in its use of a double-layer river routing, as especially shown in upper river routing section 218. The connections between the upper tiles in tile section 214 and respective Boolean logic portions within logic array 212 can be made either by first metal conductors, such as input signal KL-FN on the extreme left, or through polysilicon conductors, as is the case of input signal H on the extreme right. A provision of two layers of river routing insulated from each other allows the river routing to typically be four times as compact as the conventional single-layer river routers heretofore used.

It is therefore possible to employ the same columnar index for both a polysilicon river routing conductor and a first metal river routing conductor. One example of this is shown toward the middle of the array, where a polysilicon conductor is used to carry signal J-FN, and a first metal conductor is used to carry a signal J. At length 348, the poly conductor J-FN underlies poly conductor J, and these two conductors continue to occupy the same area in plan view for some distance. The polysilicon river-routing conductors, such as J-FN, are suitably insulated from the first metal river-router conductors, such as J, by an insulator layer such as oxide.

As indicated in FIGS. 3 and 4a, the program distinguishes between an original input or output signal and branches or variants of this signal as may be used in the actual logic array 212. Thus, for example, the input data set shown in FIG. 3 specifies a signal AM as the output of a DEFCLOCK RTL equation. A corresponding polysilicon river routing conductor AM-P is disposed toward the center of array 212. Signal AM-P is not synonymous with signal AM, but is rather a precursor of it before processing through a register, buffer or like non-Boolean circuitry.

The first metal river-routing conductors have suffixes that describe their origins. For example, the leftmost first metal river-router conductor KL-FN carries the FN suffix to indicate that it is a feedback signal that further is inverted before being reintroduced into the array. Further into the array from the right, a first metal conductor ML-N from the bottom indicates that this signal originates from an inverter.

In the upper left hand corner of array 212, polysilicon conductor AM-P is notable for its connection to a first metal conductor 350 at a via 352. In one embodiment the river routing module is able to freely mix the conductor types, switching from one conductor over to another where this is convenient. As a further example, polysilicon conductor AJ-P, at the top and third in from the right, is changed over to a first metal conductor 354 at a via 356. The changeover at this point then makes possible the underlying of a polysilicon river-routing conductor H for a selected vertical distance.

The logic array 212 as so far described has all of its inputs and outputs to either its top or bottom sides. However, input and output signals may also originate from the sides of the array 212 through horizontal second metal conductors 358 and 360, only two of which are shown in phantom for purposes of clarity. Each second metal conductor 358 and 360 is suitably spaced over the remaining illustrated structure such as by a layer of oxide, except where vias to the first metal are made. In FIG. 6, second metal conductor 360 is used to carry the PH2 clock signal from either side of logic array 212 to a via 362, where it makes contact to a short section 364 of first metal. The first metal section 364 in turn makes a via at 366 to horizontal poly gate conductor PH2, which is used to activate a series of transistors 259, 268 (FIG. 6e) and 292 (FIG. 6a) along its length.

Second metal is also used to implement a ground pad 368, from which a plurality of vias 369 are made to selected first metal conductors dropping from array 212. A voltage supply or VCC metal rail 370 also has a via 372 from it for connection to various other first metal conductors. Further second metal conductors (not shown) can be used to feed signals through array section 212 entirely without any connection thereto at all.

As in upper river routing section 218, first metal conductors in lower river routing section 220 can change over to polysilicon and back as circumstances dictate. Thus, at via 373 toward the bottom center, a first metal conductor carrying primary input F changes over to poly, which is laid out underneath a first metal conductor carrying an inverted feedback signal F-N.

In the upper left hand corner of array 212, a first metal conductor 374 and a first metal conductor 376 both carry a signal N. Conductors 374 and 376 are connected to a horizontal second metal conductor 378 through respective vias 380 and 382. Second metal horizontal conductor 378 is an extremely simplified version of a "second array" that can be implemented into array 212. As previously mentioned, this second array has no transistors or gate conductors, but is implemented into array section 212 for the cross-connection of one tile in the upper tile section 2 14 to another therein. The institution of this "second array" within array section 212 allows further flexibility in the arrangement of interconnections between the tiles in the tile section, since the conductors between the tiles do not have to be custom-designed.

FIG. 6 also demonstrates the leftward compaction employed when plotting the physical array from the symbolic array. In FIG. 4a, a DEFCLOCKL AH RTL function occupies two columns 10 and 11, in which six transistors are specified. In the physical array 212 (FIG. 6), this vertical placement is shoved leftwards as far as space will conveniently allow. The transistor 264 that senses input signal AI is leftwardly displaced from the top columnar position of poly conductor AH-P. Transistors 265 and 266 are disposed below transistor 264, but transistor 267 (sensing the value of input signal 11I) is jogged further to the left by one column index.

The design style of the invention designs a logic circuit comprising a logic array, an upper tile section, optionally a lower tile section, and poly/first metal river routing connecting these components. The logic circuit can be abutted on its sides by other logic circuits designed in a similar manner. Signals that are used in more than one logic circuit, or "global" signals, advantageously use the horizontal second metal conductors that overlie each array section and each tile section. The primary inputs and outputs at the top of the circuitry can also be used to connect to another logic circuit designed in a similar style.

Referring now to FIG. 7, a logical and schematic diagram of tile 228 (FIG. 5) is shown. The circuit elements shown in FIG. 7 are identified with the same numbers that identify their respective physical counterparts in FIG. 5 wherever possible. A first module of tile 228 is the sense amplifier and precharge clock 230, which is physically located closest to random logic array 212 (FIG. 5). Amplifier 230 has a PH2 clock input and a Q-P signal input, and outputs an inverted signal on line 390 to a latch module 238. In addition to the regular signal input at 390, latch module 238 has a serial scan chain input 392. Any signal appearing on scan chain line 392 is clocked with the aid of a clock signal PH2SCAN. The regular input signal appearing on 390 is clocked with PH2RUN.

An output 394 of the first latch is split and input into a second latch 240. The second latch 240 has another serial scan clock PH1SSCANADV for clocking a scan signal through latch 240, and further has a clock signal input PH1RUN to clock a regular signal through latch 240. Latch 240 has an output 396. One branch of output 396 becomes the input of an output buffer 242, which outputs primary output signal Q. Another branch of second register output 396 is fed back to logic array 212 (FIG. 5) as a feedback input signal Q-F on a return conductor 398.

Figure 8:
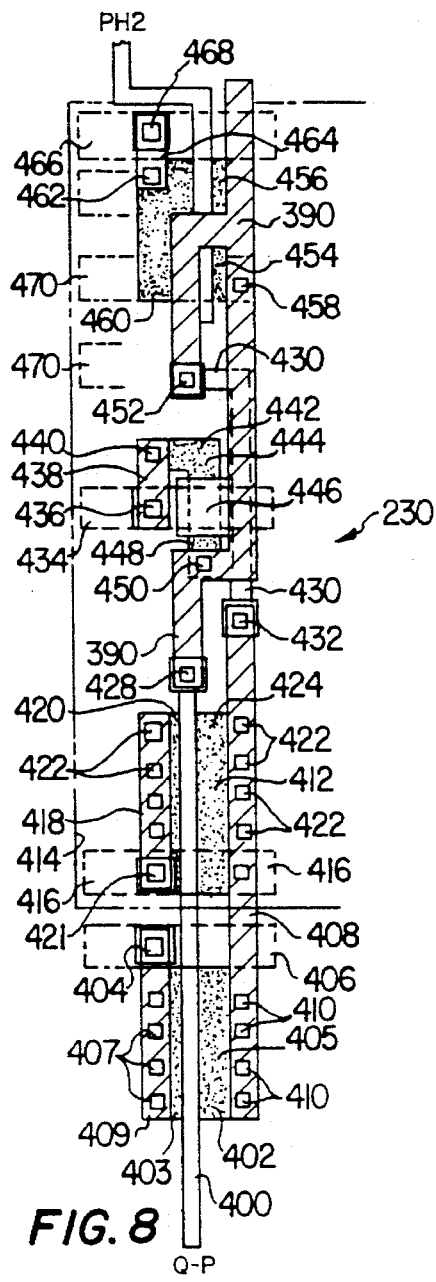
FIG. 8 is a magnified schematic plan view of a tile from the tile section shown in FIG. 5, and corresponding to the circuit diagram shown in FIG. 7.

Turning now to FIG. 8, the sense amplifier portion 230 of tile 228 (FIGS. 5 and 7) is shown in magnified plan view. Like numbers identify like parts wherever possible. Tile portion 230 illustrates the use of non-regular transistors and other components in a custom designed tile to be used in conjunction with the invention. Tile portion 230 takes an elongate shape stretching from an input Q-P on a polysilicon gate conductor 400 at the bottom, to a primary output line 390 at the top that is implemented in first metal. The elongate shape of tile portion 230 is chosen in order to best match the horizontal dimension of the Boolean logic portion in connection with which it is implemented.

Signal Q-P is output from logic array 212 (FIG. 6) and becomes the gating signal for a large, n-channel transistor 402. A source region 403 of transistor 402 is connected through a plurality of contacts 407, a short first metal conductor 409 and a via 404 to a horizontal second metal ground connection 406 that runs across the entire tile section 214 (FIG. 5). All second metal conductors herein-are shown in phantom for purposes of clarity. A drain region 405 of transistor 402 is connected to a vertical first metal conductor 408 through a plurality of contacts 410.

A large p-channel transistor 412 is formed within an n-tank region 414, only a portion of which is shown. N-tank 414 preferably extends across the entire tile section 214 for disposal of other p-channel transistors therein. The placement and arrangement of the tiles within tile section 214 are made such that the number of such tank regions is minimized. This in turn reduces spacing requirements.

Like transistor 410, transistor 412 is gated by polyconductor 400, and selectively connects a voltage supply VCC provided on horizontal second metal conductor 416 to the first metal conductor 408.

Second metal conductor 416 is connected to a first metal conductor 418 through a via 421, and a plurality of contacts connect second metal conductor 416 to a drain region 420 of transistor 412. As in transistor 402, a plurality of contacts 422 connect a source region 424 of transistor 412 to first metal conductor 408. P-channel transistor 412 and N-channel transistor 402 act as a CMOS pair.

Above transistor 412, poly gate conductor 400 is connected to a vertical first metal conductor 390 through a via 428, and first metal conductor 408 is connected to a poly conductor 430 through a via 432. A further second metal voltage supply rail 434 is connected through a via 436 to a short first metal conductor segment 438. This in turn is connected through a contact 440 to a drain region 442 of a relatively weak inverting transistor 444. Inverting transistor 444 is gaged by an extension 446 of polysilicon conductor 430, which is through most of its length shown in phantom beneath first metal conductor 390. A source region 448 of transistor 444 is connected to first metal conductor 390 through a contact 450.

Polysilicon conductor 430 joins up with first metal conductor 390 at a via 452. A source region 454 of a precharge transistor 456 is connected to first metal conductor 390 through a contact 458. Precharge transistor 456 is gated by a polysilicon gate conductor PH2 that is input from the top. Poly conductor PH2 eventually connects to another second metal horizontal rail through an appropriate contact (not shown) to a clock source. A drain region 460 of transistor 456 is connected to a short second metal conductor 462 through a contact 464. Conductor 462 in turn is connected to a voltage supply second metal horizontal rail 466 through a via 468. First metal conductor 390 is output to the next portion 238 of tile 228.

The ends of further horizontal second metal conductors 470 are shown in phantom to indicate their relative placement. These conductors 470 do not connect with any of the structure of tile portion 230, but carry signals to other tiles occupying similar vertical positions within overhead tile section 214. Tile portion 230 illustrates the great variance that can be had in transistor sizes, gate formations and numbers of contacts when a custom design is used for the non-Boolean portions of a logic equation. Parameters for a design such as that shown in FIG. 8 are preferably stored in a library from which the operating computer program can select particular tile portions depending on the needs of the logic equation to be implemented. In this way, a control logic array can be quickly designed that uses the best features of a regular logic array and standard cells.

In summary, a comprehensive control logic layout system has been shown and described. The Boolean portions of logic equations are implemented in a regular logic array that is optimized according to a cost function. As the Boolean expressions are implemented into a geometric array, a factorization is performed that permits the horizontal merger of selected ones of the logic transistors. Once the logic equations have been put into the logic array in a particular order, appropriate tiles are implemented in one or more adjacent tile sections to implement the non-Boolean portions of the logic expressions. The tiles and the array are interconnected with the use of a preferably two-layer river router that can make connections to points well within the logic array.

While preferred embodiments and their advantages have been disclosed in the above detailed description, the invention is not limited thereto, but only by the spirit and scope of the appended claims.

What is claimed is:

1. A method for implementing a random logic array at a face of a semiconductor layer, comprising the steps of:

defining a plurality of logic terms, each logic term having at least one logic operation to be implemented into the array, each term outputting a result and having a plurality of input signals;

mapping a plurality of array transistors into selected intersections of row locations and column locations in a symbolic array for implementing said logic terms, each transistor including a source region, and a drain region to be diffused into said layer;

identifying transistors in said symbolic array located at adjacent column locations and having identical row locations in said symbolic array;

mapping selected ones of the identified transistors into a transistor array, such that the identified transistors have continuous merged drain regions and source regions.

2. A method for laying out a plurality of logic terms in an array of transistors having rows and columns, the terms generally oriented in a columnar direction, the transistors switched by signals carried by elongate gate conductors disposed in the rows, each transistor having a source region and a drain region, comprising:

assigning a row index to each transistor;

for a first term, forming the transistors into one or more first groups, each first group activated by a set of gate conductors having adjacent row locations;

laying out the first groups into the transistor array, the transistors in each first group having the same column index as and row indices adjacent to the remaining transistors in the group;

for a second term, forming the transistors into second groups, each second group activated by a set of gate conductors having adjacent row locations;

matching a second group in the second term with a first group in the first term with respect to the row indices of the transistors thereof; and assigning a column index to the second group of the second term such that the source and drain regions of the transistors thereof will be merged with the respective source and drain regions of the transistors in the matched first group in the first term.

3. The method of claim 2, wherein each transistor of any one term is displaced in a columnar direction from the remaining transistors thereof such that the term is generally elongate in a columnar direction, the method comprising the further steps of:

ordering the first, second and remaining terms in a side-by-side order in the array, the first term adjacent to the second term;

assigning each gate conductor a row index;

assigning each transistor row index based on the row index of the gate conductor operable to switch the transistor;

in the first term, assigning each transistor a respective column index;

assigning to selected ones of the second transistor groups in the second term respective column indices such that the source or drain areas in each selected second transistor group in the second term will overlap with respective source or drain areas in a first transistor group in the first term;

assigning each of the nonselected second transistor groups in the second term a respective column index such that the source and drain areas thereof will be spaced from the source and drain areas of any transistor in the first term; and laying out the transistors into a geometric array using the row and column indices thereof.

4. The method of claim 3, and further including the steps of:

determining whether the second term is an AND term or an OR term; and if the second term is an OR term, assigning each second group in the second term a respective column index such that the source and drain areas thereof will be spaced from the source and drain areas of any transistor in the first term.

5. The method of claim 2, and further including the steps of:

comparing the row indices of transistors in a first group to the row indices of transistors in the second group having row indices most similar to those of transistors in the first group;

if the row indices of the transistors in the compared first group match the row indices of the transistors in the compared second group, assigning a column index to the compared second group that is adjacent the column index of the compared first group term; and if the row indices of the transistors in the compared first group do not match the row indices of the transistors of the compared second group, assigning a single column index to the compared second group that is two indices removed from the column index of the compared first group.

6. The method of claim 5, and further including the steps of:

before said step of assigning a column index to a compared second group adjacent the column index of the first group, determining whether a conductive sneak path will exist between the first and second terms.

7. A method for laying out a logic array of transistors in rows and columns, comprising the steps of:

arranging a plurality of gate conductors in a plurality of rows, each gate conductor carrying a signal for switching a gate of at least one transistor, each gate conductor having a gate row index;

assigning each transistor to a transistor point location having a transistor row index and a column index, the transistor row index for any one transistor point location offset in a columnar direction from a corresponding gate row index;

assigning each of a plurality of transistor contacts to a respective contact point location having a contact row index and a column index, each transistor contact contacting a source diffusion area or a drain diffusion area of a transistor, the contact row index offset from the nearest gate row index;

assigning each of a plurality of first metal conductor segments to a first metal point location having a gate row index and a column index;

mapping a transistor source/drain area from each transistor point such that the area extends in a columnar direction across both the respective gate row index and two contact row indices on either side of the gate row index, the source/drain area extending in a row direction to incorporate two column indices;

mapping a contact from each contact point such that the contact is made to the corner of a source/drain area; and mapping the first metal conductor segments from the first metal points to connect pairs of the contacts together.

8. The method of claim 7, wherein said step of assigning transistor contacts to contact point locations includes the further steps of:

assigning a column index to each contact point location that either equals the column index of the contacted transistor or is offset therefrom by one column index; and assigning a row index to each contact that is offset by one-half the distance between an adjacent gate row index and the next gate row index.

9. The method of claim 7, and further including the steps of:

mapping each first metal conductor segment from a respective first metal point location such that a columnar edge of each first conductor segment is colinear with at least one columnar edge of a transistor source/drain area.

10. A method for connecting a plurality of first terminals in a logic array to a like plurality of second terminals in a circuit, the logic array and the circuit formed at a face of a semiconductor layer, the method comprising:

forming a plurality of terminal pairs each comprising a first terminal and a second terminal;

designating each terminal pair as either a first level type or a second level type;

for each terminal pair of the first level type, river routing conductive leads from the first terminal thereof to the second terminal thereof using predominately conductors formed at a first level insulatively disposed over said face; and for each terminal pair of the second level type, river-routing conductive leads from the first terminal thereof to the second terminal thereof using conductors formed at a second level insulatively spaced over the first level.

11. The method of claim 10, and further including the steps of:

river routing the terminal pairs of the first level type using predominately polycrystalline silicon conductors; and river routing the terminal pairs of the second level type using conductors formed in a first metallization step.

12. The method of claim 10, wherein said step of river routing the terminal pairs of the first level type includes the steps of:

routing a first level conductor segment in the first level until a first level obstacle prevents further routing in either the y direction or a selected side in the x direction;

specifying a contact between the end of first level conductor segment and a beginning of a second level conductor segment;

routing the second level conductor segment until the prospective river routing path is clear of first level array obstacles;

specifying a contact between an end of the second level conductor segment and the beginning of a further first level segment; and routing the further first level segment in the first level.

13. The method of claim 10, and further including the steps of:

dividing the terminal pairs between a right block and a left block;

river routing each right block conductor between a first terminal thereof and a corresponding second terminal thereof preferentially toward the right until x-coordinate of the second terminal thereof is reached; and river routing each left block conductor between a first terminal thereof and a corresponding second terminal thereof preferentially toward the left until the x-coordinate of the second terminal thereof is reached.

14. The method of claim 10, and further comprising the steps of:

building a first level obstacle array from array structures through which the routing of first level conductors is not allowed;

building a second level obstacle array from array structures through which the routing of second level conductors is not allowed;

river routing the first level conductors to avoid obstacles within the first level obstacle array; and river routing the second level conductors to avoid obstacles in the second level obstacle array.

15. The method of claim 14, wherein said step of forming the first level obstacle array comprises forming an array of obstacle to the routing of polysilicon conductor segments, the obstacles including transistor diffusion areas, contacts and gate conductors of the transistors.

16. The method of claim 14, and further including the step of forming the second level obstacle array from obstacles through which the routing of first metal conductor segments is not allowed, the obstacles including first metal transistor interconnections, contacts between first metal and transistor diffusion areas, and contacts between first metal conductors and polysilicon conductors.

17. The method of claim 10, and further including the steps of:

assigning x-coordinates to the first and second terminals of each terminal pair;

preferentially routing a conductor between the first and second terminals toward a predetermined side in the x-direction until the x-coordinate of the second terminal is reached by the conductor; and thereafter routing the conductor in the y-direction until the y-coordinate of the second terminal is reached.

18. The method of claim 10, wherein said step of river routing each terminal pair of the first level type includes the further steps of:

routing the conductive lead at the second level until there are no adjacent array obstacles in the first level in a preferred side direction from the end of the lead;

switching the lead from the second level to the first level; and completing the routing of the lead between the first and second terminals in the first level.

19. The method of claim 10, and further including the steps of:

establishing x- and y-coordinates for each of the first terminals;

establishing a fixed x-coordinate and an arbitrarily large y-coordinate for each of the second terminals;

routing conductors between the first and second terminals, turning each routed conductor between the x direction and the y direction as necessary to avoid array obstacles and other conductors;

storing the y-coordinate of the last turn required to be made in the routed conductor for each terminal pair;

determining the maximum of the y-coordinates of the last turns; and determining the y-coordinate of each of the second terminals based on the maximum last turn y-coordinate.

20. The method of claim 10, wherein said circuit is a tile section comprising a plurality of tiles for the implementation of non-Boolean circuit components, each second terminal connected to a tile conductor, said step of designating terminal pairs as either a first level type or a second level type made based on the type of a tile conductor to which the second terminal is connected.

21. The method of claim 10, wherein said step of designating terminal pairs as either a first level type or a second level type is made based on the relative congestion of river-routed conductors in the first and second levels.

* * * * *